(12) United States Patent
Shima

(10) Patent No.: US 8,080,845 B2
(45) Date of Patent: Dec. 20, 2011

(54) SEMICONDUCTOR DEVICE

(75) Inventor: Masashi Shima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 190 days.

(21) Appl. No.: 12/486,068

(22) Filed: Jun. 17, 2009

(65) Prior Publication Data

US 2009/0321824 A1 Dec. 31, 2009

(30) Foreign Application Priority Data

Jun. 25, 2008 (JP) ................................. 2008-166586

(51) Int. Cl.
*H01L 29/66* (2006.01)

(52) U.S. Cl. ......... 257/336; 257/E29.165; 257/E29.273; 257/E21.209; 257/E21.437; 257/E21.664

(58) Field of Classification Search .................. 257/335, 257/336

See application file for complete search history.

(56) References Cited

U.S. PATENT DOCUMENTS

| | | | | |
|---|---|---|---|---|
| 4,291,321 A * | 9/1981 | Pfleiderer et al. ............. | 257/336 |
| 4,300,150 A * | 11/1981 | Colak ........................... | 257/336 |
| 4,769,686 A * | 9/1988 | Horiuchi et al. .............. | 257/373 |
| 5,146,291 A * | 9/1992 | Watabe et al. ................ | 257/344 |
| 5,217,913 A * | 6/1993 | Watabe et al. ................ | 438/304 |
| 5,254,867 A * | 10/1993 | Fukuda et al. ................ | 257/411 |
| 5,371,394 A * | 12/1994 | Ma et al. ....................... | 257/335 |
| 5,409,848 A * | 4/1995 | Han et al. ...................... | 438/302 |
| 5,473,184 A * | 12/1995 | Murai ........................... | 257/382 |
| 5,532,508 A * | 7/1996 | Kaneko et al. ................ | 257/336 |
| 5,719,425 A * | 2/1998 | Akram et al. ................. | 257/344 |
| 5,763,916 A * | 6/1998 | Gonzalez et al. ............. | 257/345 |
| 5,801,416 A * | 9/1998 | Choi et al. .................... | 257/335 |
| 5,856,693 A | 1/1999 | Onishi | |
| 6,046,472 A * | 4/2000 | Ahmad et al. ................ | 257/336 |
| 6,093,948 A * | 7/2000 | Zambrano et al. ............ | 257/339 |
| 6,198,131 B1 * | 3/2001 | Tung ............................. | 257/345 |
| 6,215,163 B1 * | 4/2001 | Hori et al. ..................... | 257/411 |
| 6,232,191 B1 * | 5/2001 | Jeng et al. ..................... | 438/303 |
| 6,236,085 B1 * | 5/2001 | Kawaguchi et al. .......... | 257/345 |
| 6,281,062 B1 * | 8/2001 | Sanchez ........................ | 438/217 |
| 6,316,297 B1 * | 11/2001 | Matsuda ....................... | 438/174 |
| 6,501,128 B1 * | 12/2002 | Otsuki .......................... | 257/330 |

(Continued)

FOREIGN PATENT DOCUMENTS

JP 8-64689 A 3/1996

(Continued)

*Primary Examiner* — Eugene Lee
*Assistant Examiner* — Mohammed Shamsuzzaman
(74) *Attorney, Agent, or Firm* — Westerman, Hattori, Daniels & Adrian, LLP

(57) ABSTRACT

A semiconductor device includes a gate insulating film formed over a semiconductor substrate, a gate electrode formed over the gate insulating film, a source region formed in the semiconductor substrate, a first drain region formed on the other side of the gate electrode and formed in the semiconductor substrate, the first drain region having one end extending below the gate electrode, the first drain region having a first impurity concentration, a second drain region formed in the first drain region and spaced apart from the gate electrode by a first distance, the second drain region having a second impurity concentration higher than the first impurity concentration, a third drain region formed in the first drain region and spaced apart from the gate electrode by a second distance, the second distance being greater than the first distance, the third drain region having a third impurity concentration.

2 Claims, 16 Drawing Sheets

U.S. PATENT DOCUMENTS

| | | | |
|---|---|---|---|
| 6,777,749 B2* | 8/2004 | Rumennik et al. | 257/343 |
| 6,830,978 B2 | 12/2004 | Ariyoshi et al. | |
| 6,963,109 B2* | 11/2005 | Kikuchi et al. | 257/335 |
| 7,011,998 B1* | 3/2006 | Ju et al. | 438/197 |
| 7,109,562 B2* | 9/2006 | Lee | 257/488 |
| 7,378,323 B2* | 5/2008 | Chen | 438/303 |
| 7,514,747 B2* | 4/2009 | Fukuda | 257/347 |
| 7,514,749 B2* | 4/2009 | Kato et al. | 257/360 |
| 2003/0022445 A1* | 1/2003 | Taniguchi et al. | 438/257 |
| 2006/0017103 A1* | 1/2006 | Szelag | 257/335 |
| 2006/0133146 A1* | 6/2006 | Maekawa et al. | 365/185.14 |
| 2006/0138568 A1* | 6/2006 | Taniguchi et al. | 257/408 |
| 2007/0120194 A1* | 5/2007 | Shiraishi et al. | 257/368 |
| 2008/0180974 A1* | 7/2008 | Shiraishi et al. | 363/24 |
| 2008/0220580 A1* | 9/2008 | Kato et al. | 438/275 |
| 2008/0258236 A1* | 10/2008 | Yasuoka et al. | 257/392 |
| 2009/0224318 A1* | 9/2009 | Hatori et al. | 257/339 |

FOREIGN PATENT DOCUMENTS

| | | |
|---|---|---|
| JP | 2004-79888 A | 3/2004 |
| JP | 2007-27622 A | 2/2007 |

* cited by examiner

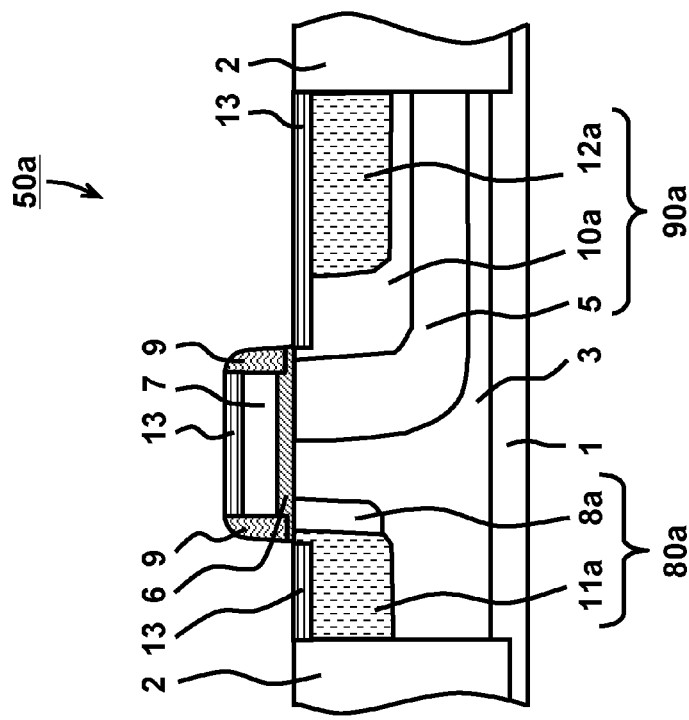
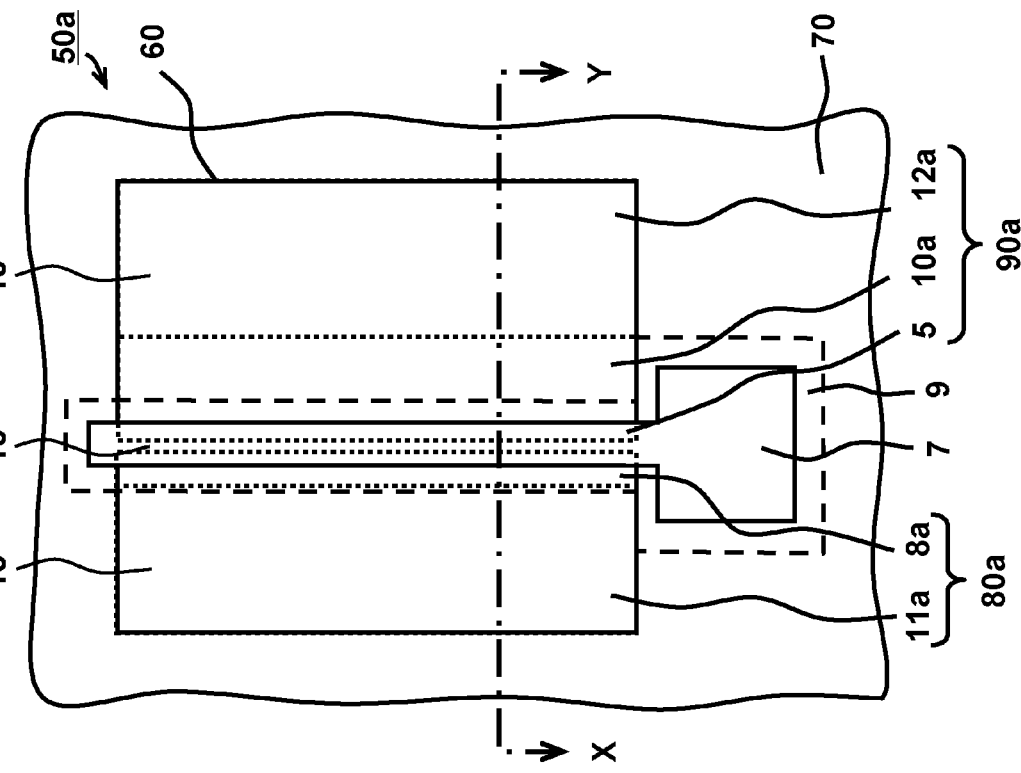
FIG.1A
FIG.1B

US 8,080,845 B2

SEMICONDUCTOR DEVICE

CROSS-REFERENCE TO RELATED APPLICATION

This application is based upon and claims the benefit of priority of the prior Japanese Patent Application No. 2008-166586 filed on Jun. 25, 2008, the entire contents of which are incorporated herein by reference.

FIELD

An aspect of the embodiments discussed herein is directed to a structure of a metal insulator semiconductor (MIS) transistor.

BACKGROUND

For example, the high-voltage MIS transistor, not only preferable high-frequency characteristics but also high withstanding voltages of a source and a drain are expected.

In the high withstanding voltage MIS transistor, a high voltage is applied to a drain region. Then, a high electric field is generated at the border between the drain region and a channel region, thereby creating junction breakdown (breakdown phenomenon) at the border portion. Therefore, it is a problem for the high withstanding voltage how electric field generated between the border between the drain region and the channel portion is relieved.

In order to relieve the electric field, upon forming the high-voltage MIS transistor, Japanese Laid-open Patent Publication No. 08-64689 discusses the structure of such a high withstanding voltage MIS transistor formed in a drain region remotely from a gate electrode with a high impurity concentration. Herein, "the drain region is formed remotely from the gate electrode" means that the drain region is formed at a distance from the gate electrode.

With the high-voltage MIS structure discussed in Japanese Laid-open Patent Publication No. 08-64689, the realization of a high withstanding voltage needs the increase in remote distance between the gate electrode and an area with a high impurity concentration in the drain region. However, the remote distance increases and on-resistance of the transistor then rises. Thus, the reduction in drive capacity of the transistor may be caused. The on-resistance rises because the area with a low impurity concentration increases between the gate electrode and the area with a high impurity concentration and the parasitic resistance then rises.

SUMMARY

According to an aspect of an embodiment, a semiconductor device includes a gate insulating film formed over a semiconductor substrate, a gate electrode formed over the gate insulating film, a source region formed in the semiconductor substrate on one side of the gate electrode, a first drain region formed on the other side of the gate electrode and formed in the semiconductor substrate, the first drain region having one end extending below the gate electrode, the first drain region having a first impurity concentration, a second drain region formed in the first drain region and spaced apart from the gate electrode by a first distance, the second drain region having a second impurity concentration higher than the first impurity concentration, a third drain region formed in the first drain region and spaced apart from the gate electrode by a second distance, the second distance being greater than the first distance, the third drain region having a third impurity concentration higher than the second impurity concentration, and a silicide layer formed over the surface of the second drain region and the third drain region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 1A and 1B are diagrams illustrating the structure of an n-type MIS transistor 50a according to the first embodiment;

DESCRIPTION OF EMBODIMENTS

Figure 2A:
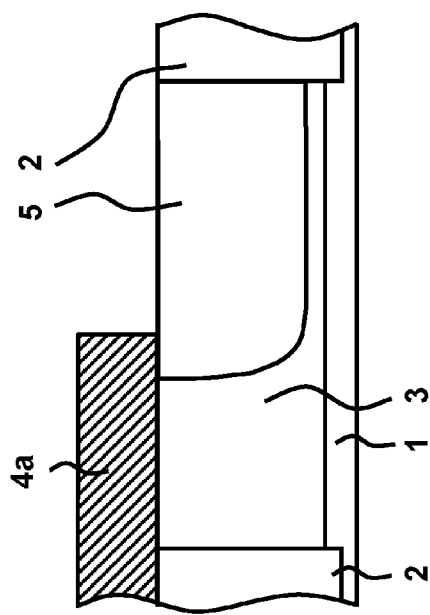
FIGS. 2A-2D are diagrams illustrating a method of manufacturing the n-type MIS transistor 50a according to the first embodiment.

Hereinbelow, first and second embodiments will be described. However, the present technique is not limited to these embodiments.

According to the first embodiment, FIGS. 1A to 7C describe the details of the structure of an n-type MIS transistor 50a and a method of manifesting the n-type MIS transistor 50a. Incidentally, the MIS transistor means a field effect transistor (FET).

With the n-type MIS transistor 50a according to the first embodiment, a second drain region 10a having a third impurity concentration higher than a second impurity concentration is formed within a first drain region 5, thereby controlling the increase in electrical field at a gate electrode 7 and the end of the first drain region 5 and the generation of hot carriers due to the increase in electrical field. Further, a silicide layer 13 on the second drain region 10a prevents the increase in parasitic resistance at the drain region. Accordingly, it is possible to provide a semiconductor device including the n-type MIS transistor 50a in which withstanding voltage performance is improved while suppressing the increase in on-resistance and a method of manufacturing the semiconductor device.

FIGS. 1A and 1B illustrate the structure of the n-type MIS transistor 50a according to the first embodiment. FIG. 1A is a plan view of the n-type MIS transistor 50a. FIG. 1B is a cross-sectional view along an X-Y line in FIG. 1A.

Referring to FIG. 1A, reference numeral 5 denotes the first drain region, reference numeral 7 denotes the gate electrode, reference numeral 8a denotes a first source region, reference numeral 9 denotes a side wall, reference numeral 10a denotes a second drain region, reference numeral 11a denotes a second source region, reference numeral 12a denotes a third drain region, reference numeral 60 denotes an active region, reference numeral 70 denotes a device separating region, reference numeral 80a denotes a source region, and reference numeral 90a denotes a drain region.

Referring to FIG. 1A, the device separating region 70 is disposed around the n-type MIS transistor 50a. The active region 60 is a rectangular one set to the device separating region 70. The gate electrode 7 is disposed so that a rectangular pattern portion thereof is across the center of the active region 60. The side wall 9 is disposed around the gate electrode 7.

The first source region 8a is disposed to the active region 60 to be partly overlapped to one side of the gate electrode 7. The second source region 11a is disposed adjacently to one side of the gate electrode 7 with a predetermined width. As will be described with reference to FIG. 1B, the first source region 8a and the second source region 11a are disposed adjacently to each other.

The first drain region 5 is disposed to the active region 60 to be partly overlapped to the other side of the gate electrode 7 with a predetermined width. The second drain region 10a is formed within the first drain region 5. The second drain region 10a is disposed with a predetermined width at a distance offset from the gate electrode 7. The third drain region 12a is disposed within the second drain region 10a having an intermediate impurity concentration of the drain region with a predetermined width at a distance remote from the gate electrode 7.

The silicide layer 13 is formed to cover the gate electrode 7 excluding the side wall 9 and the active region 60.

Incidentally, a specific description will be given of the distance between one end of the first drain region 5 and the gate electrode 7, the distance between one end of the second drain region 10a and the gate electrode 7, and the distance between one end of the third drain region 12a and the gate electrode 7 with reference to FIG. 5.

Referring to FIG. 1B, with the n-type MIS transistor 50a according to the first embodiment, reference numeral 1 denotes an n-type silicon substrate, reference numeral 2 denotes the device separating region, reference numeral 3 denotes a p-type well region, reference numeral 5 denotes the first drain region, reference numeral 6 denotes a gate insulating film, reference numeral 7 denotes the gate electrode, reference numeral 8a denotes the first source region, reference numeral 9 denotes the side wall, reference numeral 10a denotes the second drain region, reference numeral 11a denotes the second source region, reference numeral 12a denotes the third drain region, reference numeral 13 denotes the silicide layer, reference numeral 80a denotes the source region, and reference numeral 90a denotes the drain region. Incidentally, the same elements in FIG. 1B as those illustrated in FIG. 1A are designated by the same reference numerals.

The n-type silicon substrate 1 has an n-type impurity concentration of, e.g., $1 \times 10^{16}$ cm$^{-3}$. The device separating region 2 has the structure of Shallow Trench Isolation. The p-type well region 3 is formed by injecting ions of boron (B) to the n-type silicon substrate 1. The p-type well region 3 is formed with, e.g., $5 \times 10^{17}$ cm$^{-3}$ as a concentration of boron (B) and a depth from, e.g., 200 nm to 500 nm.

The gate insulating film 6 is formed onto the n-type silicon substrate 1. A thickness of the gate insulating film 6 is, e.g., 5 nm to 10 nm.

The gate electrode 7 is formed onto the n-type silicon substrate 1 via the gate insulating film 6. A height of the gate electrode 7 is, e.g., 100 nm. A width of the gate electrode 7 is, e.g., 400 nm to 900 nm.

The side wall 9 is formed on the side wall of the gate electrode 7. The side wall 9 may be used by laminating silicon nitride and oxide silicon as insulating materials. Preferably, a forming width of the side wall 9 is formed with a thickness from 50 nm to 200 nm.

The source region 80a and the drain region 90a are disposed in the n-type silicon substrate 1. The source region 80a has the first source region 8a and the second source region 11a. The drain region 90a has the first drain region 5, the second drain region 10a, and the third drain region 12a.

Preferably, the first source region 8a is formed within a range of about 50 nm from the long side of a rectangular pattern of the gate electrode 7 and within a range of about 50 nm as the maximal depth from the surface of the n-type silicon substrate 1. That is, the first source region 8a is formed within the n-type silicon substrate 1 on one side of the gate electrode 7, with a first impurity concentration, which will be described later. Further, the first source region 8a is formed to a first depth of the n-type silicon substrate 1.

The second source region 11a is disposed with a predetermined width from the end at which the side wall 9 is positioned on the n-type silicon substrate 1. The maximal forming depth of the second source region 11a is preferably formed within a range of about 100 nm from the surface of the n-type silicon substrate 1. That is, the second source region 11a has a fifth impurity concentration higher than the first impurity concentration, which will be described later. Further, the second source region 11a is preferably formed up to a second depth deeper than the first depth of the n-type silicon substrate 1.

The first drain region 5 of the drain region 90a is formed within the n-type silicon substrate 1 to be partly overlapped under the gate electrode 7. A forming depth of the first drain region 5 is preferably formed within a range of 300 nm from the surface of the n-type silicon substrate 1. That is, the first drain region 5 is formed to the other side of the gate electrode 7, having one end thereof that is under the gate electrode 7, with the second impurity concentration, formed to the n-type silicon substrate 1.

The second drain region 10a is disposed within the n-type silicon substrate 1 to be adjacent to the long side of a rectangular pattern of the gate electrode 7. A forming depth of the second drain region 10a is preferably within a range of 100 nm from the surface of the n-type silicon substrate 1. Incidentally, a forming depth of the second drain region 10a is preferably formed to be shallower than the first drain region 5. Incidentally, the second drain region 10a controls the generation of hot carriers, and may be further formed to control the increase in electrical field at the gate electrode 7 and the end of the first drain region 5 due to the formation of the silicide layer 13 on the second drain region 10a and the generation of hot carriers due to the increase in electrical field. That is, the second drain region 10a is formed remotely from the gate electrode 7 on the n-type silicon substrate 1 with a first distance within the first drain region 5, having a third impurity concentration higher than the second impurity concentration.

The third drain region 12a is disposed within the n-type silicon substrate 1 to be adjacent to the long side of a rectangular pattern of the gate electrode 7. The third drain region 12a is preferably formed within a range of 50 nm from the surface of the n-type silicon substrate 1. Incidentally, a forming depth of the third drain region 12a is preferably formed to be shallower than the second drain region 10a. The third drain region 12a is formed within the second drain region 10a with the distance offset from the gate electrode 7 with a predetermined width. The third drain region 12a is preferably offset with a width ranging from 0 nm to 200 nm. That is, the third drain region 12a is formed within the second drain region 10a, remotely from the gate electrode 7 on the n-type silicon substrate 1 with a second distance longer than the first distance, having a fourth impurity concentration higher than the third impurity concentration.

The silicide layer 13 is disposed on the gate electrode 7 and on the surface of the n-type silicon substrate 1 of the second source region 11a, the second drain region 10a, and the third drain region 12a. The silicide layer 13 is preferably formed with a thickness ranging from, e.g., 20 nm to 50 nm. The silicide layer 13 is formed on the gate electrode 7 so as to prevent the increase in parasitic resistance of the second source region 11a, the second drain region 10a, and the third drain region 12a.

FIGS. 2 to 4 describe a method of manufacturing the n-type MIS transistor 50a according to the first embodiment.

FIG. 2A illustrates a state for preparing the n-type silicon substrate 1, the device separating region 2, and the p-type well region 3. The n-type silicon substrate 1 has an n-type impurity concentration of, e.g., $1.0 \times 10^{16}$ cm$^{-3}$.

As illustrated in FIG. 2A, the device separating region 2 is preferably formed with shallow trench isolation. Next, ions of boron (B) are injected to the n-type silicon substrate 1 under conditions of acceleration energy as, e.g., 200 KeV and the amount of dose as, e.g., $1 \times 10^{13}$ cm$^{-2}$, thereby forming the p-type well region 3. Further, the p-type well region 3 is formed to adjust a threshold.

Figure 2B:
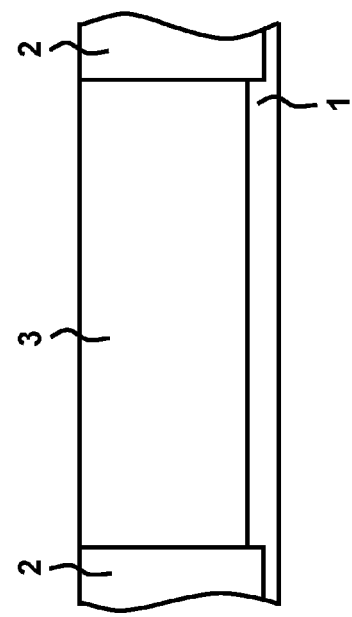

FIG. 2B illustrates a state for forming the first drain region 5 on the n-type silicon substrate 1. As illustrated in FIG. 2B, a resist layer (not illustrated) is formed onto the n-type silicon substrate 1. Next, the resist layer 4a is formed by patterning the resist layer, and the resist layer 4a covers a portion without the ion injection. Subsequently, with the resist layer 4a as a mask, ions of phosphorus (P) as n-type impurity are partly injected to the p-type well region 3, under conditions of acceleration energy as, e.g., 200 KeV and the amount of dose as, e.g., $1 \times 10^{13}$ cm$^{-2}$, thereby forming the first drain region 5. After forming the first drain region 5, the resist layer 4a is removed. That is, this is an operation of forming the first drain region 5 having a first impurity concentration at the first region within the n-type silicon substrate 1.

Figure 2C:
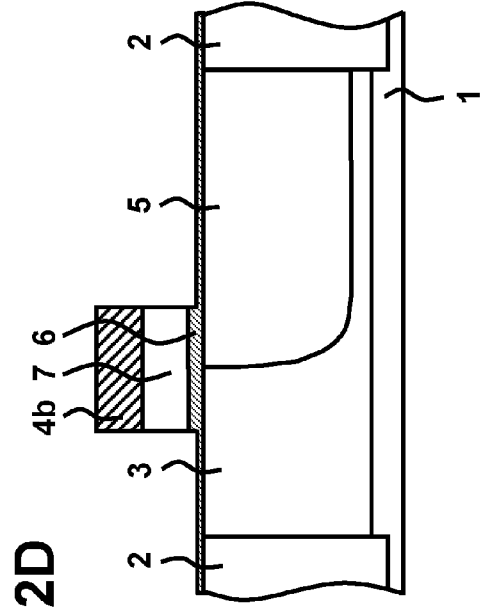

FIG. 2C is a diagram illustrating a state for forming the gate insulating film 6 on the n-type silicon substrate 1. Referring to FIG. 2C, the surface of the n-type silicon substrate 1 is subjected to thermal oxidation processing, thereby forming the gate insulating film 6 with a thickness ranging, e.g., 5 nm to 10 nm of the surface of the n-type silicon substrate 1. The gate insulating film 6 contains, e.g., an oxide silicon ($SiO_2$). The gate insulating film 6 is assumed to have a withstanding voltage of 3.3V upon using DC for the n-type MIS transistor 50a.

Figure 2D:
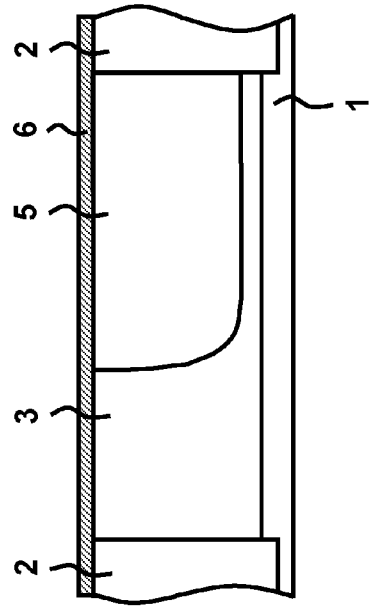

FIG. 2D is a diagram illustrating a state for forming the gate electrode 7 on the gate insulating film 6. First of all, a polysilicon layer may be deposited on the gate insulating film 6 with a thickness of about 100 nm by, e.g., using Chemical Vapor Deposition (CVD). Subsequently, a resist layer (not illustrated) is formed on the polysilicon layer. Subsequently, the resist layer is patterned, thereby forming the resist layer 4b. With anisotropic etching, the polysilicon layer is etched by using the resist layer 4b as a mask, thereby forming the gate electrode 7. The gate electrode 7 is formed across the p-type well region 3 and the first drain region 5. After forming the gate electrode 7, the resist layer 4b is removed.

Figure 3A:
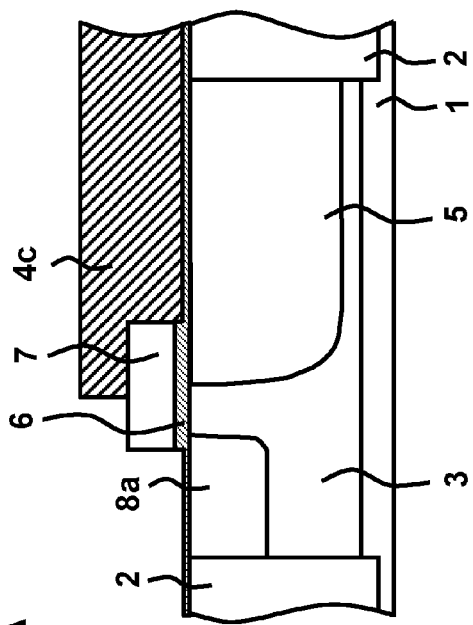
FIGS. 3A-3D are diagrams illustrating the method of manufacturing the n-type MIS transistor 50a according to the first embodiment.

FIG. 3A is a diagram illustrating a state for forming the first source region 8a within the n-type silicon substrate 1. Referring to FIG. 3A, a resist layer (not illustrated) is formed to the whole the n-type silicon substrate 1. Subsequently, the resist layer 4c remains on the first drain region 5 by patterning the resist layer. Subsequently, ions of phosphorus (P) as an n-type impurity are partly injected to the p-type well region 3 by using the gate electrode 7 and the resist layer 40 as masks under conditions of acceleration energy as, e.g., 30 KeV and the amount of dose ranging, e.g., $1 \times 10^{17}$ cm$^{-2}$ to $1 \times 10^{18}$ cm$^{-2}$, thereby forming the first source region 8a. After forming the first source region 8a, the resist layer 4c is removed. That is, this is an operation of forming the first source region 8a having the second impurity concentration to the gate electrode 7 within the n-type silicon substrate 1 on one side of the first drain region 5.

Figure 3B:
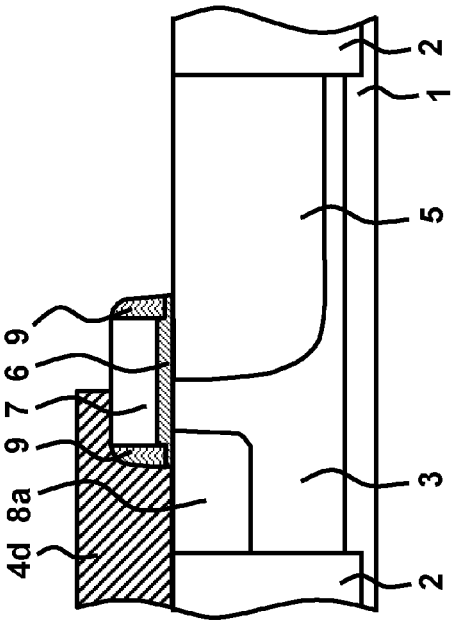

FIG. 3B is a diagram illustrating a state for forming the side wall 9 on the n-type silicon substrate 1 and on the side wall of the gate electrode 7. Referring to FIG. 3B, a silicon dioxide film (not illustrated) may be deposited on the whole n-type silicon substrate 1 with a thickness of, e.g., 30 nm by using, e.g., CVD method. Subsequently, a silicon nitride film (not illustrated) is deposited with a thickness of 30 nm by using, e.g., CVD method. Subsequently, the silicon dioxide film and the silicon nitride film deposited on the n-type silicon substrate 1 are entirely subjected to anisotropic etching, thereby forming the side wall 9 on the side wall of the gate electrode 7. The side wall 9 has a laminating structure of the silicon dioxide film and the silicon nitride film. A forming width of the side wall 9 preferably ranges from, e.g., 50 nm to 200 nm.

Figure 3C:
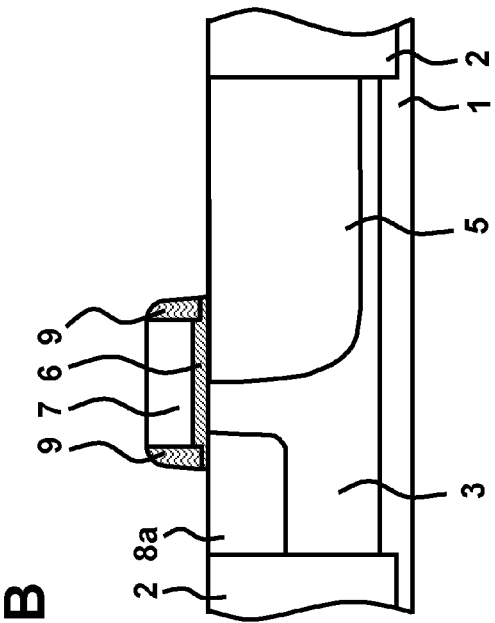

FIG. 3C is a diagram illustrating a state for forming the resist layer 4d on the first source region 8a of the n-type silicon substrate 1. Referring to FIG. 3C, a resist layer (not illustrated) is formed to the whole n-type silicon substrate 1.

Subsequently, the resist layer 4d of the source region remains on the first source region 8a with a low impurity concentration by patterning the resist layer. That is, this is an operation of forming the first resist layer across the side wall 9 above the first source region 8a and the first source region 8a.

Figure 3D:
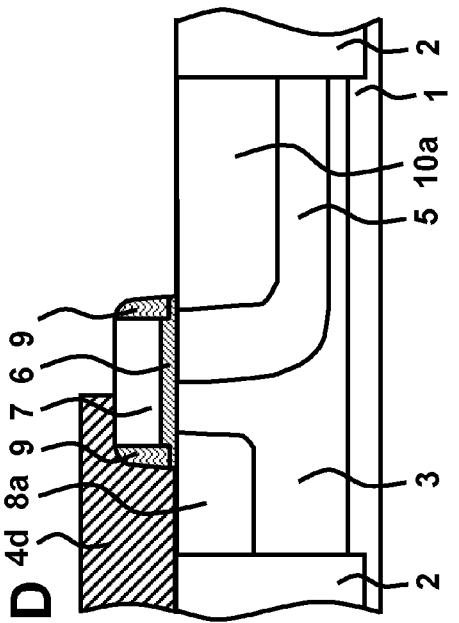

FIG. 3D is a diagram illustrating a state for forming the second drain region 10a with an intermediate impurity concentration within the first drain region 5 with a low impurity concentration on the n-type silicon substrate 1. Referring to FIG. 3D, ions of phosphorus (P) as an n-type impurity are partly injected to the first drain region 5 with a low impurity concentration under conditions of acceleration energy, e.g., 30 KeV and the amount of dose ranging, e.g., $1 \times 10^{18}$ cm$^2$ to $1 \times 10^{19}$ cm$^2$ by using the gate electrode 7, the side wall 9, and the resist layer 4d as masks, thereby forming the second drain region 10a with an intermediate impurity concentration. After forming the second drain region 10a with an intermediate impurity concentration, the resist layer 4d is removed. That is, this is an operation of forming the second drain region 10a with a third impurity concentration higher than the first impurity concentration within the first drain region 5 by using the first resist layer 5, the gate electrode 7, and the side wall 9 as masks.

Figure 4A:
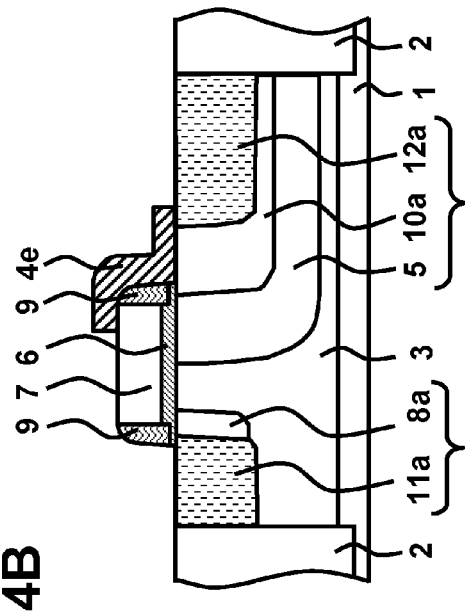
FIGS. 4A-4D are diagrams illustrating the method of manufacturing the n-type MIS transistor 50a according to the first embodiment.

FIG. 4A is a diagram illustrating a state for forming the resist layer 4e to a part of the gate electrode 7, to the side wall 9 of the drain region side, and to a part of the second drain region 10a with an intermediate impurity concentration. Referring to FIG. 4A, a resist layer (not illustrated) is formed over the whole of the n-type silicon substrate 1. Subsequently, the resist layer 4e remains, by patterning the resist layer, on a part of the gate electrode 7, on the side wall 9 of the drain region side, and on a part of the second drain region 10a. Incidentally, the distance at which the resist layer 4e is formed from the end of the side wall 9 on the drain region side to the second drain region 10a is preferably, e.g., 0 nm to 200 nm. That is, this is an operation of forming a second resist layer across the side wall 9 above the first drain region 5 and a part of the second drain region 10a.

Figure 4B:
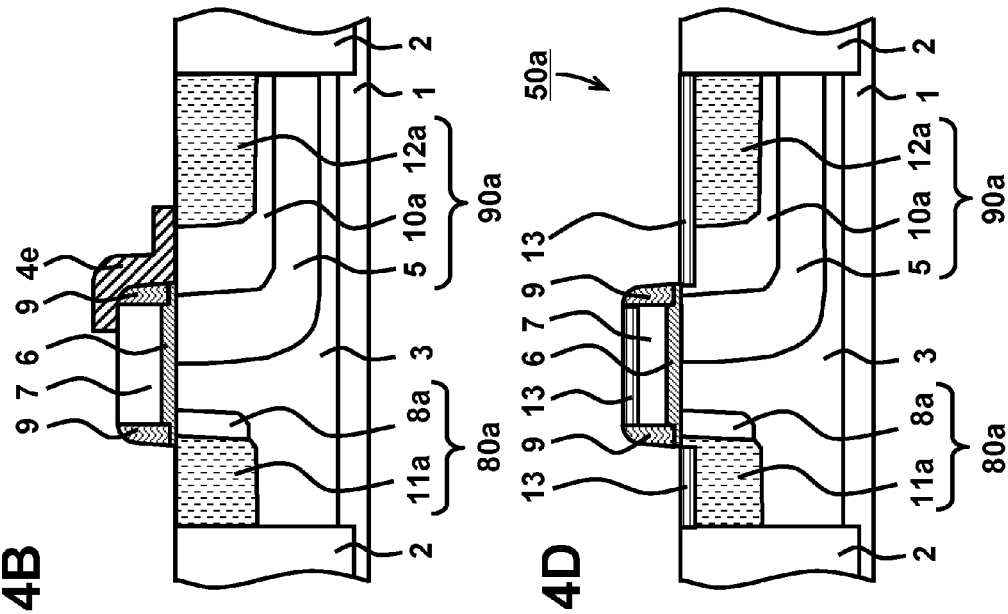

FIG. 4B is a diagram illustrating a state for forming the third drain region 12a to a part of the first source region 8a, the second source region 11a, and a part of the second drain region 10a. Referring to FIG. 4B, ions of phosphorus (P) as an n-type impurity are injected under conditions of the acceleration energy of, e.g., 10 KeV and the amount of dose of, e.g., $6 \times 10^{15}$ cm$^2$ by using the gate electrode 7, the side wall 9, and the resist layer 4e as masks, thereby forming the third drain region 12a to a part of the first source region 8a, the second source region 11a, and a part of the second drain region 10a. As a consequence thereof, the distance at which the resist layer 4e is formed from the end of the side wall 9 of the drain region side to the second drain region 10a ranges, e.g., 0 nm to 200 nm. Further, the third drain region 12a is formed by injecting ions by using, as masks, the resist layer 4e formed on the second drain region 10a from the end of the side wall 9 of the drain region side. Therefore, the third drain region 12a is formed on the second drain region 10a, remotely from the end of the side wall 9 on the drain region side with the distance ranging 0 nm to 200 nm.

As mentioned above, on one side of the gate electrode 7, the source region 80a is formed with the first source region 8a of the source region with a low impurity concentration and the second source region 11a of the source region with a high impurity concentration. Similarly, the drain region 90a is formed on the other side of the gate electrode 7 with the first drain region 5 with a low impurity concentration, the second drain region 10a with an intermediate impurity concentration, and the third drain region 12a with a high impurity concentration. Subsequently, after forming the second source region 11a of the source region with a high impurity concentration and the third drain region 12a with a high impurity concentration, the resist layer 4e is removed. That is, this is an operation of forming the second source region 11a having a forth impurity concentration higher than the second impurity concentration within the first source region 8a and the third drain region 12a having a fifth impurity concentration higher than the third impurity concentration within the second drain region 10a by using the side wall 9, the gate electrode 7, and the second resist layer as masks.

Figure 4C:
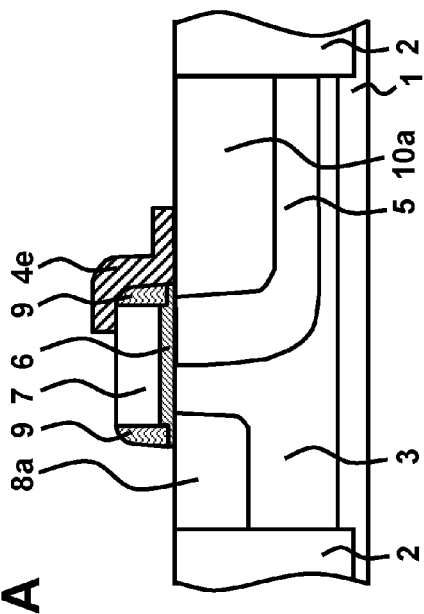

FIG. 4C is a diagram illustrating a state for activating the impurity in the source region 80a and the drain region 90a with thermal treatment to the n-type silicon substrate 1 for a short time. As a condition in a thermal treatment operation, except for a time for temperature rise and drop with, e.g., 900° C. to 1025° C., RTA processing (Rapid Thermal Annealing) is preferable for one second.

Figure 4D:
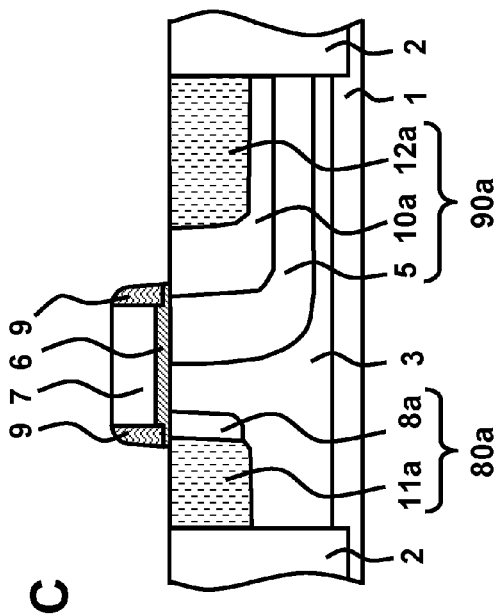

FIG. 4D is a diagram illustrating a state for forming the silicide layer 13 on the gate electrode 7, the n-type silicon substrate 1 of the second source region 11a, the second drain region 10a, and the n-type silicon substrate 1 of the third drain region 12a. Referring to FIG. 4D, nickel with a thickness of about 40 nm is deposited to the whole of the n-type silicon substrate 1 and the thermal processing is performed with a temperature of 400° C. for 60 seconds. Thereafter, unreacted cobalt may be removed. This operation results in forming the silicide layer 13 on the gate electrode 7, the n-type silicon substrate 1 of the second source region 11a, the second drain region 10a, and the n-type silicon substrate 1 of the third drain region 12a. Incidentally, in place of nickel, cobalt may be deposited.

Further, the n-type MIS transistor 50a is completed through an operations of forming an interlayer dielectric film (not illustrated), a contact hole (not illustrated), and a wiring (not illustrated).

Figure 5:
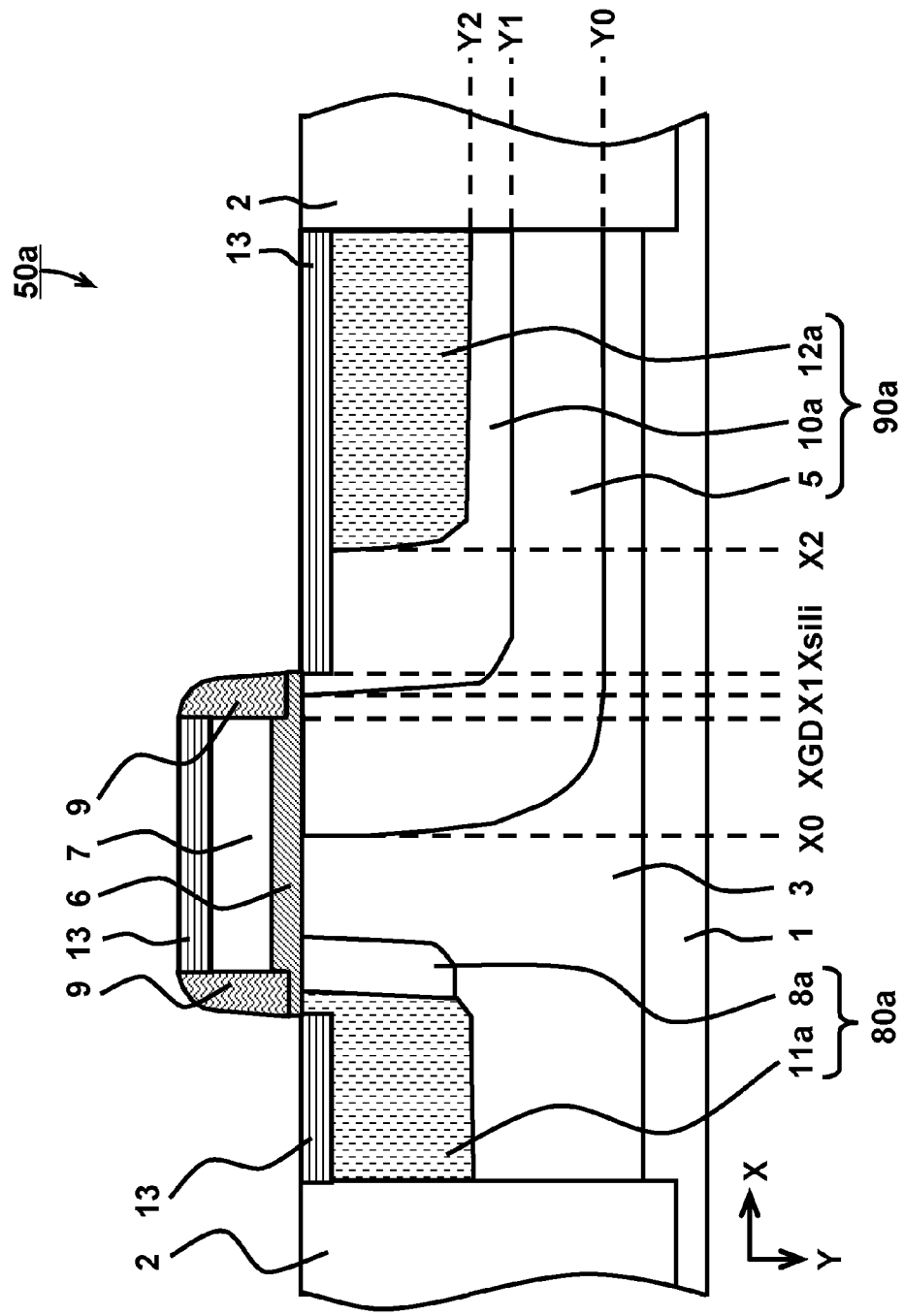
FIG. 5 is a cross-sectional view schematically illustrating the n-type MIS transistor 50a according to the first embodiment.

FIG. 5 is a diagram illustrating the structure of a drain side of the n-type MIS transistor 50a according to the first embodiment.

A direction is defined as an X direction from the source region 80a to the drain region 90a side of the gate electrode 7. The source region 80a side is on the left and the drain region 90a side is on the right. The X direction may be referred to as the horizontal direction.

Reference numeral X0 denotes the left end of the first drain region 5. Reference numeral X1 denotes the left end of the second drain region 10a. Reference numeral X2 denotes the left end of the third drain region 12a. Reference numeral XGD denotes the right end of the gate electrode 7. Reference numeral Xsili denotes the left end of the silicide layer 13 on the drain region 90a side. First of all, a description will be given of a positional relationship between the regions in the horizontal direction.

On the left end X0 of the first drain region 5, the p-type well region 3 and the first drain region 5 form pn-junction. In the first drain region 5, the second drain region 10a and the third drain region 12a are formed.

By setting, as the reference, the right end XGD of the gate electrode 7, the left end X0 of the first drain region 5 is formed below the gate electrode 7 on the left with ⅓ of the gate electrode 7.

By setting, as the reference, the right end XGD of the gate electrode 7, the distance between (X1−XGD) from the left end X1 of the second drain region 10a to the right end XGD of the gate electrode 7 is shorter than the distance between (X2-XGD) from the left end X2 of the third drain region 12a to the right end XGD of the gate electrode 7 (X1-XGD<X2-XGD).

The gate electrode 7 is formed to be overlapped to the p-type well region 3 and the first drain region 5. That is, the first drain region 5 is formed to be below the gate electrode 7. The left end X0 of the first drain region 5 is nearer the source region 80a side than the right end XGD of the gate electrode 7.

The second drain region 10a exists between the gate electrode 7 and the third drain region 12a.

The normal direction from the surface of the n-type silicon substrate 1 to the lower side thereof is defined as the Y direction. The Y direction is also referred to as the vertical direction. Reference numeral Y0 denotes the lower end of the first drain region 5. Reference numeral Y1 denotes the lower end of the second drain region 10a. Reference numeral Y2 denotes the lower end of the third drain region 12a. Next, a description will be given of a positional relationship between the regions in the vertical direction.

At the lower end Y0 of the first drain region 5, the p-type well region 3 and the first drain region 5 form pn-junction. In the first drain region 5, the second drain region 10a and the third drain region 12a are formed. The lower end Y1 of the second drain region 10a and the lower end Y2 of the third drain region 12a are formed remotely from the lower end Y0 of the first drain region 5 on the upper side (Y1, Y2<Y0). Further, the third drain region 12a is formed at the position shallower than the second drain region 10a (Y1<Y2).

Next, a description will be given of a relationship among concentrations NL, NM, and NH of conductive-type determined impurities of the first drain region 5, the second drain region 10a, and the third drain region 12a. The impurity concentrations of the regions have a relation of NL<NM<NH.

Figure 6:
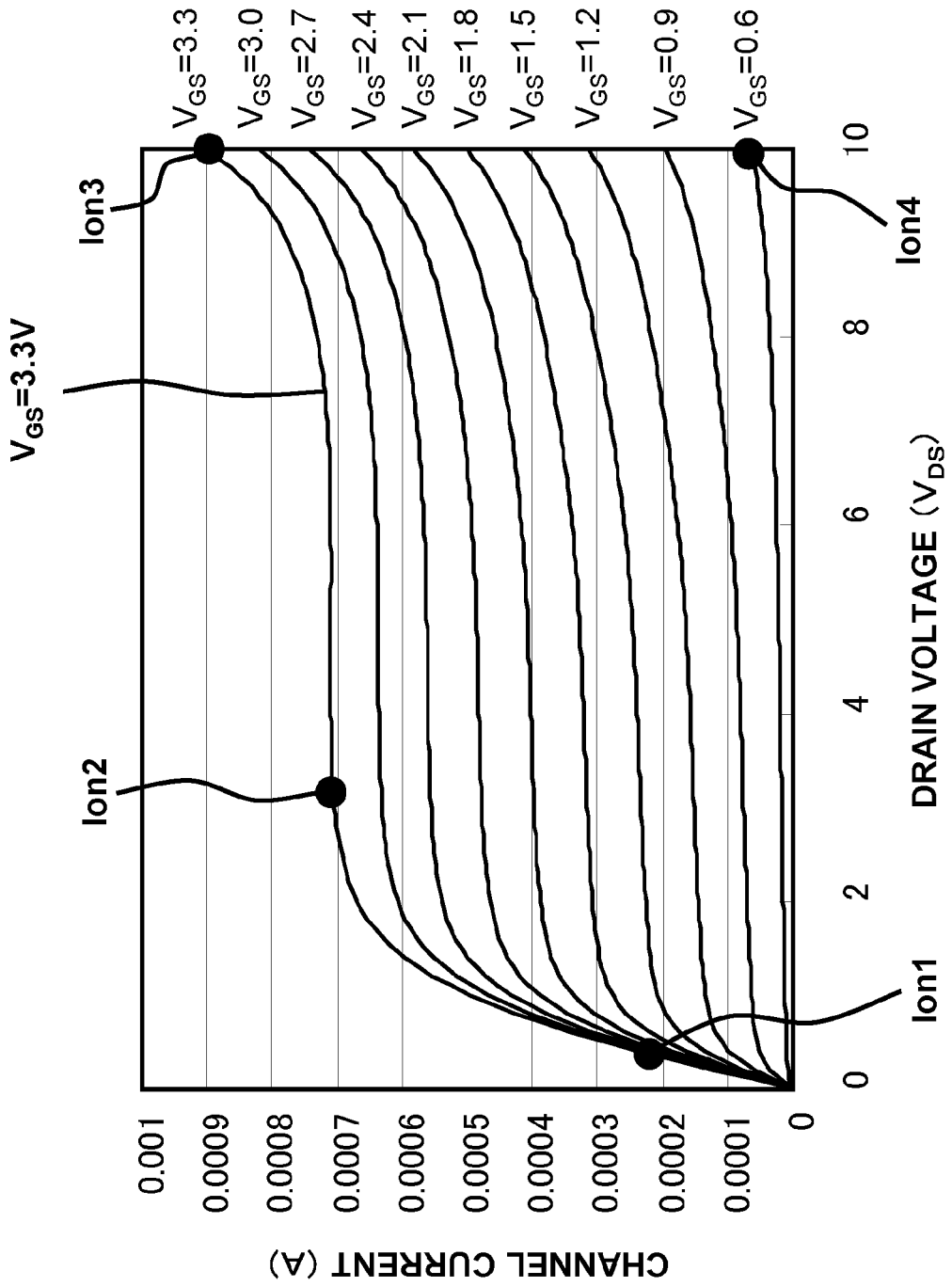
FIG. 6 is a graph illustrating characteristics (IV) of current to voltage of the n-type MIS transistor 50a according to the first embodiment.

FIG. 6 is a graph illustrating characteristics (IV) of current to voltage of the n-type MIS transistor 50a. The abscissa denotes a drain voltage ($V_{DS}$), and the ordinate denotes channel current. FIG. 6 illustrates a plurality of IV curves obtained by changing, e.g., a gate voltage ($V_{GS}$) from, e.g., 0.6V to 3.3V by 0.3V. As the gate voltage increases, a current value at a predetermined drain voltage increases and the IV curve rises up.

A plurality of operating points Ion are illustrated in FIG. 6. At an operating point Ion4, the gate voltage is, e.g., 0.6V and the drain voltage is, e.g., 10V, that is, when the differential between the gate and the drain is greatly high, i.e., 10V. At an operating point Ion3, the gate voltage is, e.g., 3.3V and the drain voltage is, e.g., 10V.

The movements of the operating point Ion4 and the operating point Ion3 become indexes indicating a withstanding voltage. At the operating points Ion4 and Ion3, the channel current does not sharply increase, and the withstanding voltage is obviously 10V or more.

At the operating point Ion1, the gate voltage is 3.3V and the drain voltage is low, i.e., 0.1V. The movement of the operating point Ion1 becomes an index indicating the on-resistance (Ron). At the operating point Ion1, the channel current sharply rises up and the parasitic resistance is obviously low. Incidentally, at the operating point Ion2, the gate voltage is 3.3V and the drain voltage is 3.3V.

As described with an application example later, upon using the n-type MIS transistor 50a for application including an amplifier for amplifying a high frequency, the operating point changes on a dynamic load line. The dynamic load line includes an operating point having a greatly high differential between potentials of the gate electrode 7 and the drain region 90a, like the operating point Ion4.

Next, a description will be given of a mobile electronic device as an application example of the n-type MIS transistor 50a according to the first embodiment with reference to FIGS. 7A to 8.

Figure 7B:
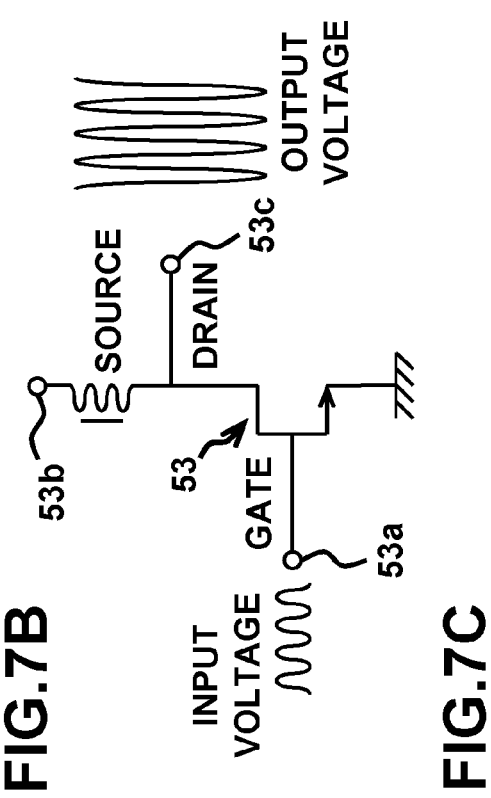
FIG. 7B is a circuit diagram illustrating a power amplification transistor as an application example of the n-type MIS transistor 50a according to the first embodiment.
Figure 7C:
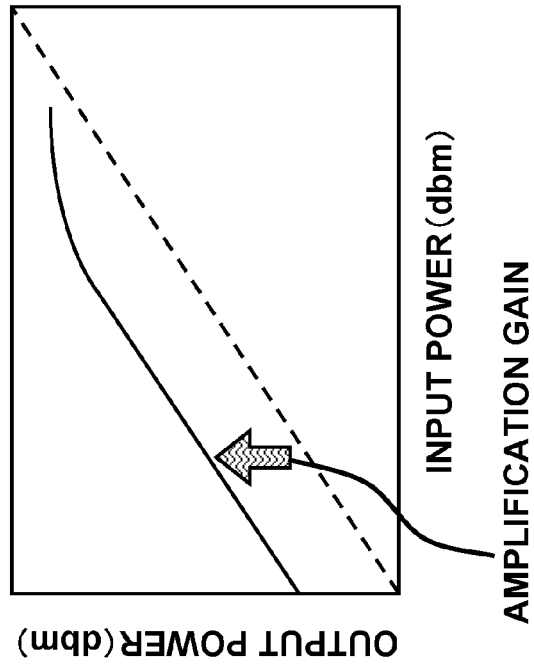
FIG. 7C is a graph schematically illustrating amplification gain of the power amplification transistor as the application example of the n-type MIS transistor 50a according to the first embodiment.
Figure 7A:
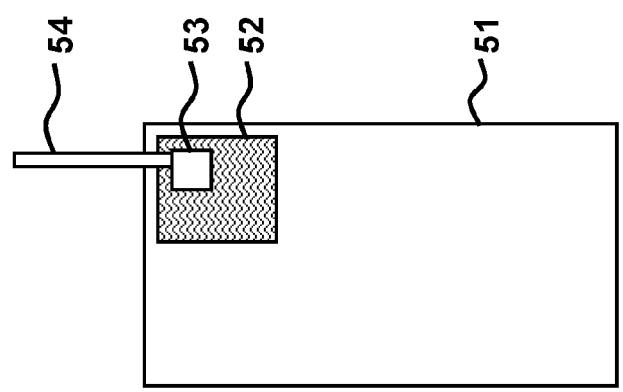
FIG. 7A is a diagram schematically illustrating a mobile electronic device 51 as an application example of the n-type MIS transistor 50a according to the first embodiment.

FIG. 7A is a diagram schematically illustrating a mobile electronic device 51 as one application of the present embodiment. The mobile electronic device 51 is, e.g., a mobile phone, including a transmitting module 52 having a power amplification transistor 53. An output of the power amplification transistor 53 is inputted to an antenna 54.

FIG. 7B is a circuit diagram illustrating the power amplification transistor 53. The power amplification transistor 53 is the n-type MIS transistor 50a according to the first embodiment or an n-type MIS transistor 50b according to the second embodiment, which will be described later. Input power with a high frequency is applied to a gate terminal 53a of the power amplification transistor 53, source power is applied to a source terminal 53b of the power amplification transistor 53, and output power obtained by amplifying the input power is outputted from a drain terminal 53c of the power amplification transistor 53. The high frequency to be inputted/outputted may be estimated ranging order of hundred MHz to GHz (ranging several hundreds MHz to several GHz).

For example, 0V and 3.3V as AC input voltages are alternately applied to the gate terminal of the power amplification transistor, and an amplified output is supplied to the drain terminal. Incidentally, the source terminal is grounded (0V). For example, a high frequency with order of GHz is inputted or outputted. Accordingly, the drain voltage reaches a greatly high value, and the differential between potentials of the gate electrode 7 and the drain region 90a is extremely over 3.3V. The locus of the change in operating point of the power amplification transistor corresponds to the dynamic load line.

FIG. 7C is a graph schematically illustrating amplification gain of the power amplification transistor 53. The abscissa and the ordinate in the graph denote an input power and an output power on the unit basis of dbm, respectively. For the input power, the power increasing corresponding to the amplification gain is outputted.

Figure 8:
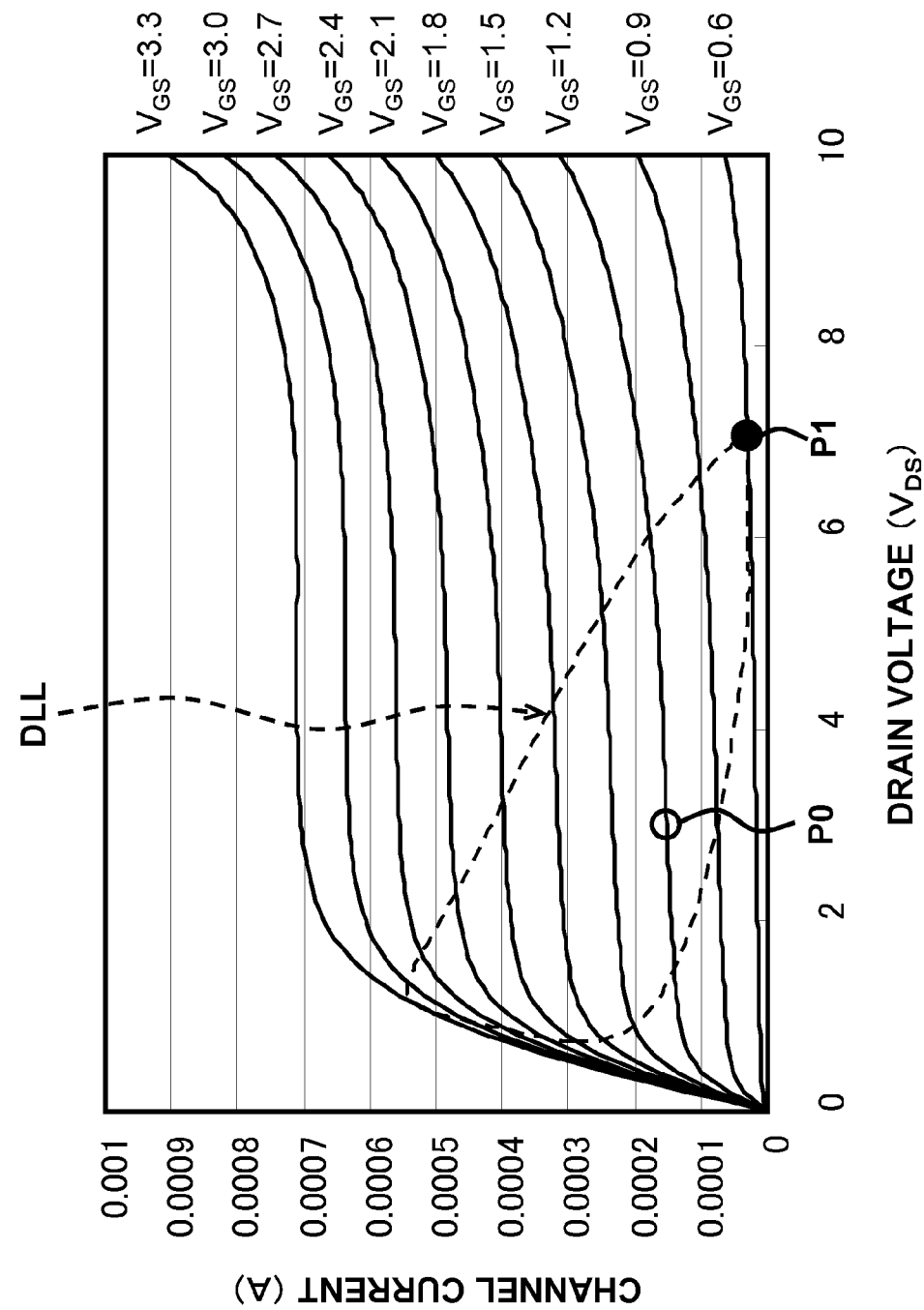
FIG. 8 is a graph illustrating a dynamic load line of the power amplification transistor as the application example of the n-type MIS transistor 50a according to the first embodiment.

FIG. 8 is a graph illustrating the dynamic load line of a power amplification transistor as an application example of the n-type MIS transistor 50a according to the first embodiment. The abscissa in the graph denotes the drain voltage on the unit basis of V (volt), and the ordinate denotes current on the unit basis of A (ampere). Further, FIG. 8 illustrates IV curves and a dynamic load line DLL when the gate voltage $V_{GS}$ is 0.6V, 0.9V, 1.2V, 1.5V, 1.8V, 2.1V, 2.4V, 2.7V, 3.0V, and 3.3V. The dynamic load line DLL indicates a mutual relation between the drain voltage and the channel current when the gate voltage changes.

On the dynamic load line DLL, the drain voltage is 7V as the highest one and the gate voltage is 0.6V close to 0V at an operating point P1. At a bias point P0, the movement of the power amplification transistor is viewed as DC.

To an operating voltage of 3.3V, the drain voltage at the operating point P1 is more than twice thereof, i.e., 7V. To the operating voltage, such withstanding voltage performance is required to be against at least not-less-than twice of the differential between potentials of the gate and the drain.

For the n-type MIS transistor 50a according to the first embodiment, the second drain region 10a is formed, thereby improving the withstanding voltage performance. The n-type MIS transistor 50a according to the first embodiment is suitable to the use as the power amplification transistor. Incidentally, the gate insulating film 6 the MIS transistor according to the first and second embodiments is withstanding the operating voltage of 3.3V at the use of DC.

As mentioned above, the n-type MIS transistor 50a has the structure according to the first embodiment. Accordingly, it is possible to obtain the withstanding voltage performance against a high differential between potentials of the gate and the drain occurring at the use for a power amplifier, e.g., at the use with a high frequency having order of GHz, with the gate insulating film that is assumed to be a withstanding voltage of 3.3V by using DC.

Figure 9:
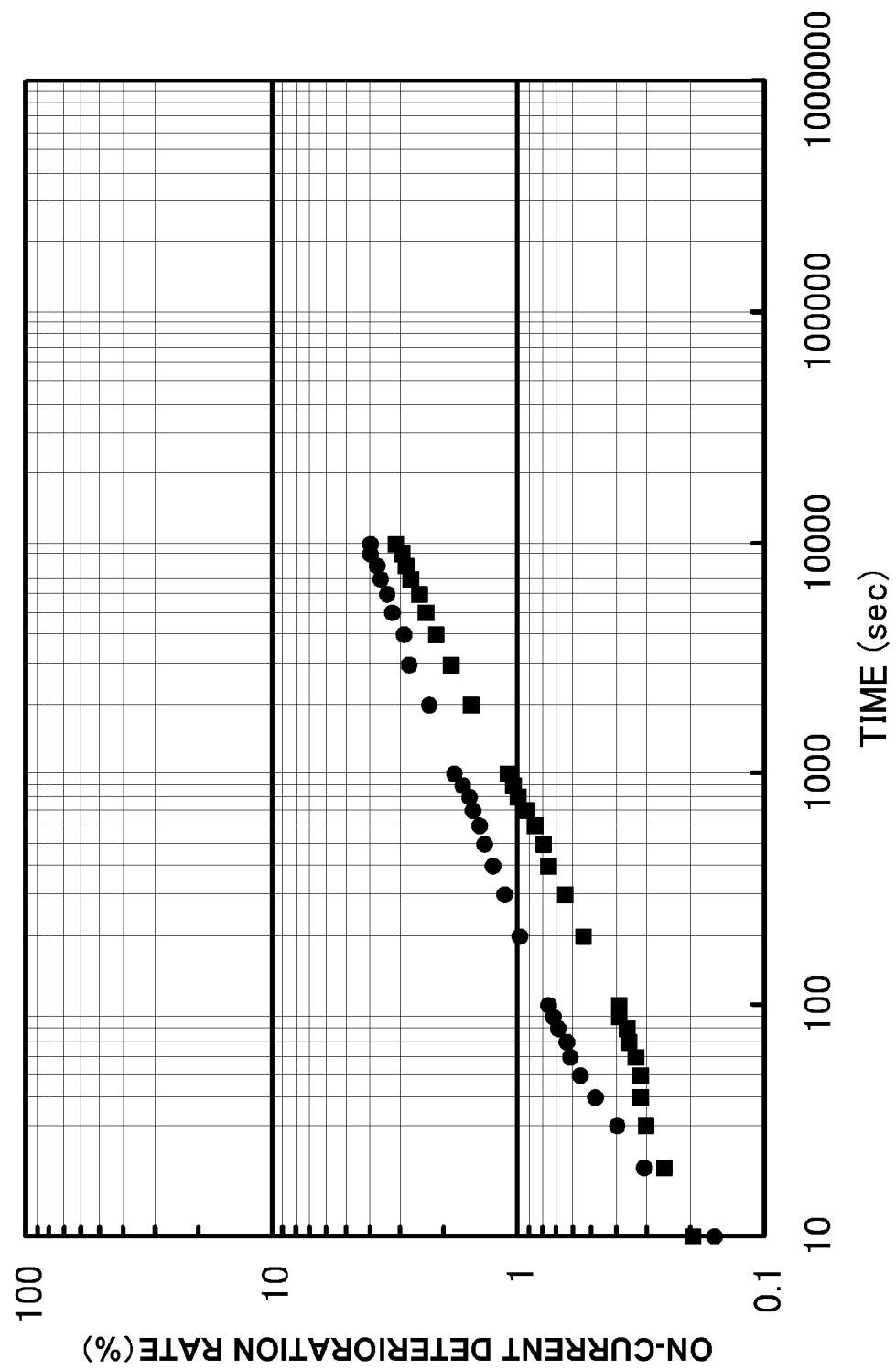
FIG. 9 is a graph illustrating a deteriorating rate (%) of on-current of the n-type MIS transistor 50a according to the first embodiment.

FIG. 9 is a double-logarithm graph of measurement of on-current (Ion) with an accelerated deterioration test of the n-type MIS transistor 50a according to the first embodiment. The accelerated deterioration test is performed under stress conditions of Vds=7.8V and Vgs=3.3V and a temperature of 25° C.

The abscissa denotes time (sec), and the ordinate denotes a deterioration rate of on-current (Ion). Plotting with black circle in FIG. 9 indicates, as a comparison, data of a conventional n-type MIS transistor having the structure excluding the second drain region 10a from the structure of the n-type MIS transistor 50a according to the first embodiment. Plotting with black squares in FIG. 9 indicates data of the n-type MIS transistor 50a according to the first embodiment.

As will be obviously with reference to FIG. 9, the plotting according to the first embodiment shifts to the down side in relation to the comparison. The deteriorating rate of the on-resistance depends on the amount of generated hot carriers at the drain region. As the deteriorating rate of the on-resistance is lower, the amount of generated hot carriers at the drain region is obviously low. Therefore, according to the first embodiment, the amount of generated hot carriers at the drain region is obviously lower than that in the comparison. That is, according to the first embodiment, it is estimated to more suppress the deterioration in on-current under the gate electrode and the end of the drain region, as compared with the comparison.

Because the second drain region 10a having the second impurity concentration higher than the first impurity concentration is formed within the first drain region 5 of the structure of the n-type MIS transistor 50a according to the first embodiment. As a consequence, it is estimated to control the increase in electrical field at the gate electrode 7 and the end of the first drain region 5, and the generation of hot carriers due to the increase in electrical field. Further, it is estimated to prevent the increase in parasitic resistance at the drain region by using the silicide layer 13 on the second drain region 10a.

With the n-type MIS transistor 50a according to the first embodiment, the second drain region 10a having the third impurity concentration higher than the second impurity concentration is formed within the first drain region 5. As a consequence, it is possible to control the increase in electrical field at the gate electrode 7 and the end of the first drain region 5 and the generation of hot carriers at the first drain region 5 due to the increase in electrical field. Further, the silicide layer 13 on the second drain region 10a prevents the increase in parasitic resistance at the drain region. Therefore, a high withstanding voltage may be realized and the deterioration in on-current is prevented, thereby improving the reliability. Accordingly, it is possible to provide the semiconductor device including the n-type MIS transistor 50a and the method of manufacturing the semiconductor device in which the increase in on-resistance is suppressed and the withstanding voltage performance may be improved.

According to the second embodiment, FIGS. 10A to 15 are diagrams for specifically describing a structure of the n-type MIS transistor 50b and a method of manufacturing the n-type MIS transistor 50b. Incidentally, according to the second embodiment, the same components as those according to the first embodiment have the same reference numerals and a description thereof is omitted.

With the n-type MIS transistor 50b according to the second embodiment, similarly to the first embodiment, the second drain region 22b having the second impurity concentration higher than the first impurity concentration is formed within the first drain region 5. As a consequence, the generation of hot carriers in the first drain region 5 is controlled. Further, the silicide layer 13 on the second drain region 22b prevents the increase in parasitic resistance at the drain region. Accordingly, it is possible to provide a semiconductor device including the n-type MIS transistor 50b and a method of manufacturing the semiconductor device in which the increase in on-resistance is suppressed and the withstanding voltage performance is improved.

Further, thermal processing spreads the third drain region 22a to the first drain region 5, thereby forming the second drain region 22b having the third impurity concentration higher than the second impurity concentration. Therefore, as compared with the first embodiment, an operation of forming the second drain region 22b with ion injection is not required, thereby reducing an operation of manufacturing the n-type MIS transistor 50b.

Figures 10A, 10B:
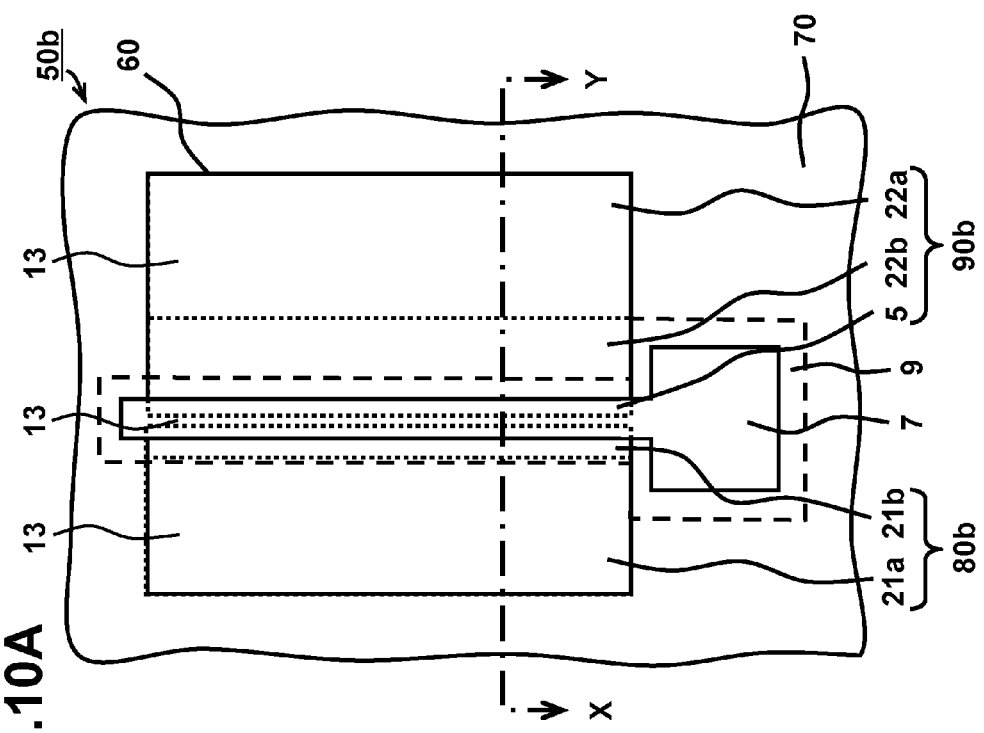
FIGS. 10A and 10B are diagrams illustrating the structure of an n-type MIS transistor 50b according to the second embodiment.

FIGS. 10A and 10B illustrate the structure of the n-type MIS transistor 50b according to the second embodiment. FIG. 10A is a plan view of the n-type MIS transistor 50b. FIG. 10B is a cross-sectional view along an X-Y line in FIG. 10A.

Referring to FIG. 10A, reference numeral 5 denotes the first drain region, reference numeral 7 denotes the gate electrode, reference numeral 9 denotes the side wall, reference numeral 21a denotes the first source region, reference numeral 21b denotes the second source region, reference numeral 5 denotes the first drain region, reference numeral 22a denotes the second drain region, reference numeral 22b denotes the third drain region, reference numeral 60 denotes the active region, reference numeral 70 denotes the device separating region, reference numeral 80b denotes the source region, and reference numeral 90b denotes the drain region.

Referring to FIG. 10A, the device separating region 70 is disposed around the n-type MIS transistor 50b. The active region 60 is a rectangular one set to the device separating region 70. A rectangular pattern portion of the gate electrode 7 is disposed to be across the center portion of the active region 60. The side wall 9 is disposed around the gate electrode 7.

The first source region 21b is disposed to the active region 60 to be partly overlapped to one side of the gate electrode 7. The second source region 21a is disposed adjacently to one side of the gate electrode 7 with a predetermined width. Incidentally, as will be described with reference to FIG. 10B later, the first source region 21b and the second source region 21a are disposed adjacently to each other.

The first drain region 5 is disposed to the active region 60 to be partly overlapped to the other side of the gate electrode 7 with a predetermined width. The second drain region 22b is formed within the first drain region 5. The second drain region 22b is disposed with the distance offset from the gate electrode 7 and with a predetermined width. The third drain region 22a is disposed in the second drain region 22b with the distance remote from the gate electrode 7 and with a predetermined width.

The silicide layer 13 is formed to cover the gate electrode 7 excluding the side wall 9 and the active region 60.

Referring to FIG. 10B, with the n-type MIS transistor 50b according to the second embodiment, reference numeral 1 denotes the n-type silicon substrate, reference numeral 2 denotes the device separating region, reference numeral 3 denotes the p-type well region, reference numeral 5 denotes the first drain region, reference numeral 6 denotes the gate insulating film, reference numeral 7 denotes the gate electrode, reference numeral 9 denotes the side wall, reference numeral 13 denotes the silicide layer, reference numeral 21a denotes the first source region, reference numeral 21b denotes the second source region, reference numeral 22a denotes the second drain region, reference numeral 22b denotes the third drain region, reference numeral 80b denotes the source region, and reference numeral 90b denotes the drain region. Incidentally, the same elements in FIG. 10B as those in FIG. 10A are designated by the same reference numerals.

The source region 80b and the drain region 90b are disposed in the n-type silicon substrate 1. The source region 80b includes the first source region 21b and the second source region 21a. The source region 80b includes the first drain region 5, the second drain region 22b, and the third drain region 22a.

The first source region 21b is preferably within a range of 50 nm from the long side of a rectangular pattern of the gate electrode 7 and a range of 100 nm as the maximal depth from the surface of the n-type silicon substrate 1. That is, the first source region 21b is formed within the semiconductor substrate 1 of one side of the gate electrode 7, having a first impurity concentration, which will be described later. Further, the first source region 21b is formed up to a first depth of the n-type silicon substrate 1.

The second source region 21a is disposed with a predetermined width from the end of the n-type silicon substrate 1, at which the side wall 9 is positioned. The maximal forming depth of the second source region 21a is preferably within 100 nm from the surface of the n-type silicon substrate 1. That is, the second source region 21a has a fifth impurity concentration higher than the first impurity concentration. Further, the second source region 21a is preferably formed up to a second depth deeper than the first depth of the n-type silicon substrate 1.

The first drain region 5 of the drain region 90b is formed within the n-type silicon substrate 1 to be partly overlapped below the gate electrode 7. The forming depth of the first drain region 5 is preferably formed within a range of 300 nm from the surface of the n-type silicon substrate 1. That is, the first drain region 5 is formed to the other side of the gate electrode 7, and one end of the first drain region 5 is below the gate electrode 7 with the second impurity concentration formed to the n-type silicon substrate 1.

The second drain region 22b is disposed within the n-type silicon substrate 1 adjacently to the long side of the rectangular pattern of the gate electrode 7. A forming depth of the second drain region 22b is preferably formed within 100 nm from the surface of the n-type silicon substrate 1. Incidentally, a forming depth of the second drain region 22b is preferably formed shallower than the first drain region 5. Incidentally, the second drain region 22b controls the generation of hot carriers, and a silicide layer is formed on the second drain region 22b, thereby controlling the increase in electrical field at the gate electrode and the end of the first drain region and the generation of hot carriers due to the increase in electrical field. That is, the second drain region 22b is formed within the first drain region 5 remotely from the gate electrode 7 on the n-type silicon substrate 1 with the first distance, having a third impurity concentration higher than the second impurity concentration.

The third drain region 22a is disposed within the n-type silicon substrate 1 adjacently to the long side of a rectangular pattern of the gate electrode 7. A forming depth of the third drain region 22a is preferably formed within a range of 50 nm from the surface of the n-type silicon substrate 1. Incidentally, a forming depth of the third drain region 22a is preferably formed shallower than the second drain region 22b. The third drain region 22a is formed within the second drain region 22b with a predetermined width and with the distance offset from the gate electrode 7. The third drain region 22a is preferably formed with offset ranging 0 nm to 200 nm. That is, the second drain region 22b is formed within the second drain region 22b remotely from the gate electrode 7 on the n-type silicon substrate 1 with a second distance longer than the first distance, having a fourth impurity concentration higher than the third impurity concentration.

The silicide layer 13 is disposed on the gate electrode 7, on the second source region 21a of the source region having a high impurity concentration, on the second drain region 22b having an intermediate impurity concentration, and on the surface of the n-type silicon substrate 1 of the third drain region 22a having a high impurity concentration of the drain region. The silicide layer 13 is preferably formed with a thickness ranging 20 nm to 50 nm.

FIGS. 11A to 13 are diagrams for illustrating a method of manufacturing the n-type MIS transistor 50b according to the second embodiment.

Figure 11A:
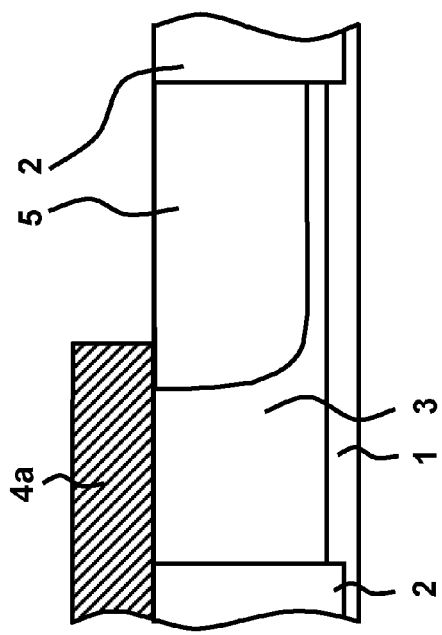
FIGS. 11A-11D are diagrams illustrating a method of manufacturing the n-type MIS transistor 50b according to the second embodiment.

FIG. 11A is a diagram illustrating a state for preparing the n-type silicon substrate 1, similarly to FIG. 2A.

Figure 11B:
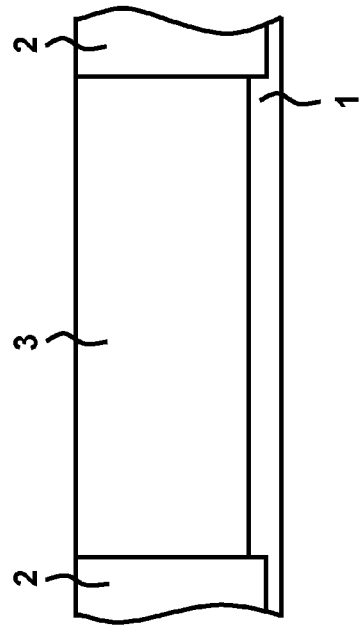

FIG. 11B is a diagram illustrating a state for forming the first drain region 5 at the first region in the n-type silicon substrate 1, similarly to FIG. 2B.

Figure 11C:
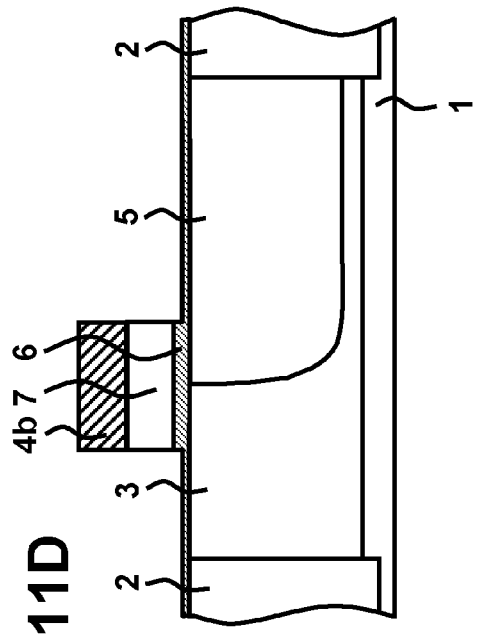

FIG. 11C is a diagram illustrating a state for forming the gate insulating film 6 on the n-type silicon substrate 1, similarly to FIG. 2C.

Figure 11D:
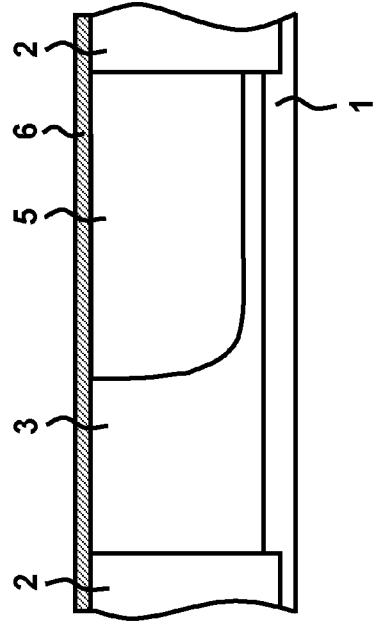

FIG. 11D is a diagram illustrating a state for forming the gate electrode 7 on the gate insulating film 6, similarly to FIG. 2D.

Figure 12A:
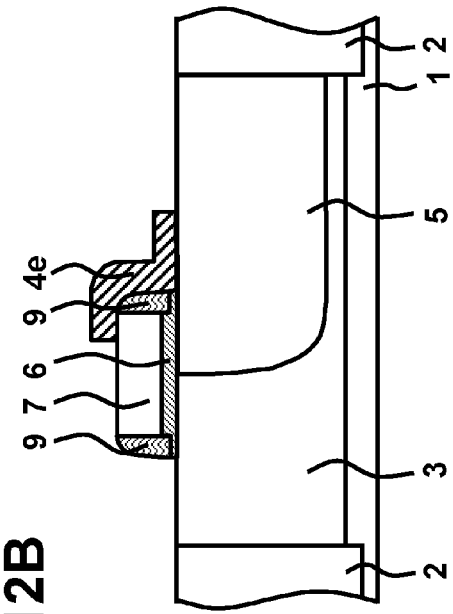
FIGS. 12A-12D are diagrams illustrating the method of manufacturing the n-type MIS transistor 50b according to the second embodiment.

FIG. 12A is a diagram illustrating a state for forming the side wall 9 to the side wall of the gate electrode 7, similarly to FIG. 3B.

Figure 12B:
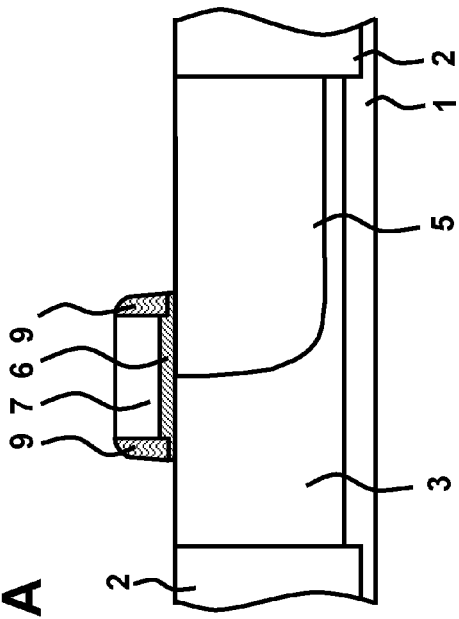

FIG. 12B is a diagram illustrating a state for forming the resist layer 4e on a part of the gate electrode 7, the side wall 9 of the drain region side, and a part of the first drain region 5. Referring to FIG. 12B, a resist layer (not illustrated) is formed on the whole n-type silicon substrate 1. Subsequently, the resist layer 4e is formed on a part of the gate electrode 7, the side wall 9 on the drain region side, and a part of the first drain region 5 by patterning the resist layer. Incidentally, the distance with which the resist layer 4e is formed on the first drain region 5 from the end of the side wall 9 on the drain region side is preferably 0 nm to 200 nm. That is, this is an operation of forming the first resist layer across the side wall 9 positioned above the first drain region 5 and a part of the first drain region 5.

Figure 12C:
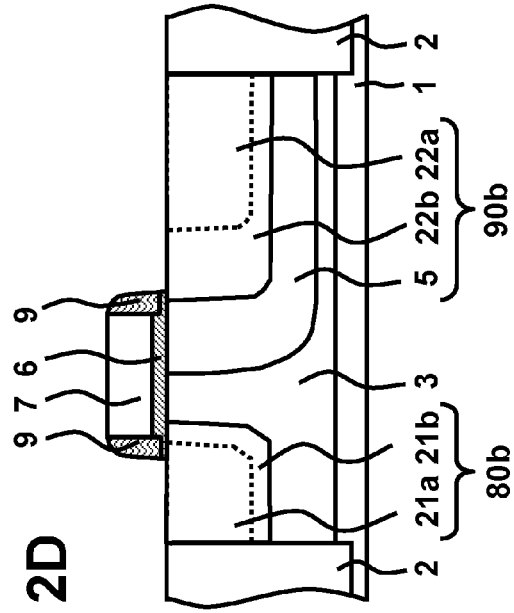

FIG. 12C is a diagram illustrating a state for forming the third drain region 22a within the n-type silicon substrate 1 on one side of the gate electrode 7 to the second source region 21a and a part of the first drain region 5. Referring to FIG. 12C, ions of phosphorus (P) as an n-type impurity are injected under conditions of acceleration energy 10 KeV and the amount of dose $6 \times 10^{15}$ cm$^{-2}$ by setting the gate electrode 7, the side wall 9, and the resist layer 4e as masks, thereby forming the third drain region 22a within the n-type silicon substrate 1 on one side of the gate electrode 7 to the second source region 21a and a part of the first drain region 5. Subsequently, the resist layer 4e is removed after forming the second source region 21a and the third drain region 22a. That is, this is an operation of forming the second source region 21a having the second impurity concentration within the n-type silicon substrate 1 on one side of the first drain region 5 by setting the first resist layer, the gate electrode 7, and the side wall 9 as masks and also forming the third drain region 22a having a third impurity concentration higher than the first impurity concentration within the first drain region 5. Similarly, this is an operation of forming the second source region 21a to a first depth of the n-type silicon substrate 1. As mentioned above, the distance at which the resist layer 4e is formed on the first drain region 5 from the end of the side wall 9 on the drain region side ranges 0 nm to 200 nm. Further, the third drain region 22a is formed by ion injection by using the resist layer 4e, as a mask, formed on the first drain region 5 from the end of the side wall 9 on the drain region side. Therefore, the third drain region 22a is formed on the first drain region 5 remotely from the end of the side wall 9 on the drain region side with the distance ranging 0 nm to 200 nm.

Figure 12D:
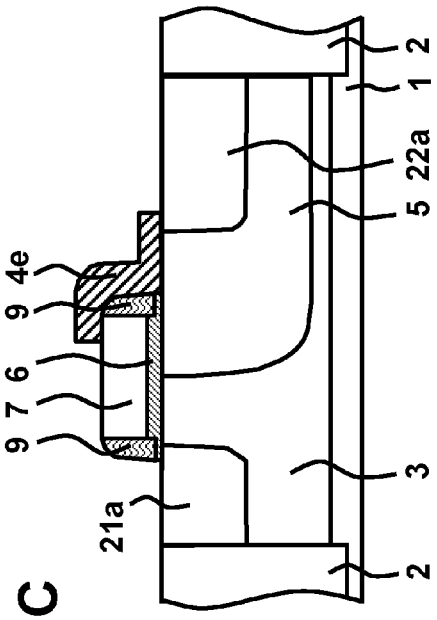

FIG. 12D is a diagram illustrating a state for activating impurities of the second source region 21a and the third drain region 22a with thermal treatment of the n-type silicon substrate 1 for a short time. A preferable condition in a thermal treatment operation is RTA (Rapid Thermal Annealing) processing for 30 seconds including times for temperature rise and temperature fall, with 900° C. to 1025° C.

With the thermal treatment operation, the impurities of the third drain region 22a spread within the first drain region 5, and the second drain region 22b is formed. Preferably, the second drain region 22b has the end on the source region side thereof that is spread to the lower end of the gate insulating film 6, and also has a third depth shallower than the first drain region 5 and deeper than the third drain region 22a. The second drain region 22b is preferably formed to a depth of 50 nm from the surface of the n-type silicon substrate 1.

Similarly, with the thermal processing, the second source region 21a spreads and the first source region 21b is formed. The first source region 21b is formed below the gate electrode 7 via the gate insulating film 6 on one side of the gate electrode 7, directed to the inside of the n-type silicon substrate 1 from the surface thereof. The first source region 21b is preferably formed to a depth of 100 nm from the surface of the n-type silicon substrate 1. That is, this is an operation of thermal processing for activating the impurities within the second source region 21a and the third drain region 22a. Similarly, this is an operation of forming the first source region 21b having a fourth impurity concentration lower than the second impurity concentration, to a second depth deeper than the first depth of the n-type silicon substrate 1.

As mentioned above, the source region 80b having the first source region 21b and the second source region 21a are formed on one side of the gate electrode 7. Similarly, the drain region 90b having the first drain region 5, the second drain region 22b, and the third drain region 22a is formed on the other side of the gate electrode 7.

Figure 13:
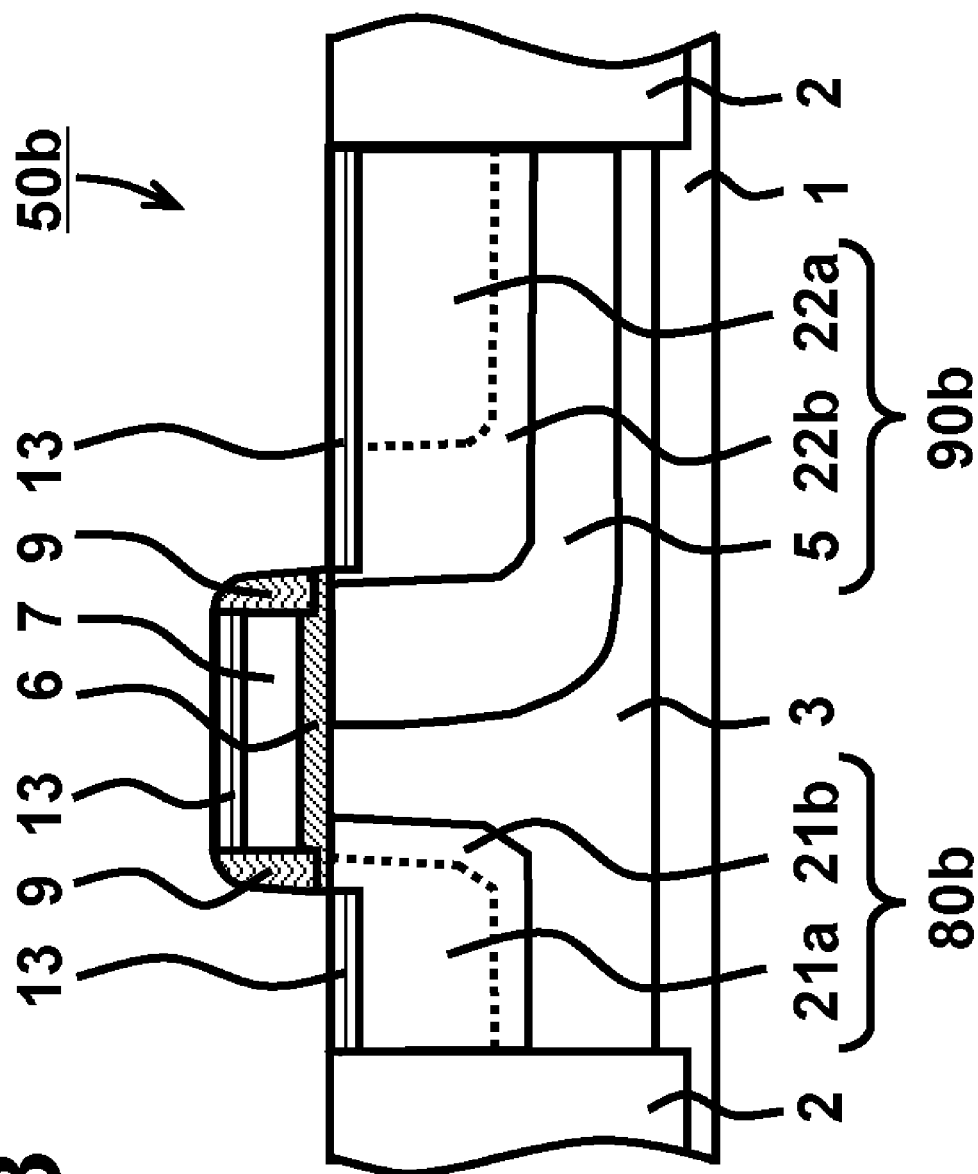
FIG. 13 is a diagram illustrating the method of manufacturing the n-type MIS transistor 50b according to the second embodiment.

FIG. 13 is a diagram illustrating a state for forming the silicide layer 13 on the gate electrode 7, the n-type silicon substrate 1 of the second source region 21a, the second drain region 22b, and the n-type silicon substrate 1 of the third drain region 22a. Referring to FIG. 13, nickel with a thickness ranging 20 nm to 50 nm is deposited to the whole surface and thermal processing is then performed with a temperature of 400° C. for 30 seconds. Thereafter, unreacted cobalt is removed. This operation enables the formation of the silicide layer 13 on the gate electrode 7, the n-type silicon substrate 1 of the second source region 21a, the second drain region 22b, and the n-type silicon substrate 1 of the third drain region 22a. Incidentally, cobalt may be deposited in place of nickel.

The n-type MIS transistor 50b is completed through operations including formation of an interlayer dielectric film (not illustrated), a contact hole (not illustrated), and a wiring (not illustrated).

Figure 14:
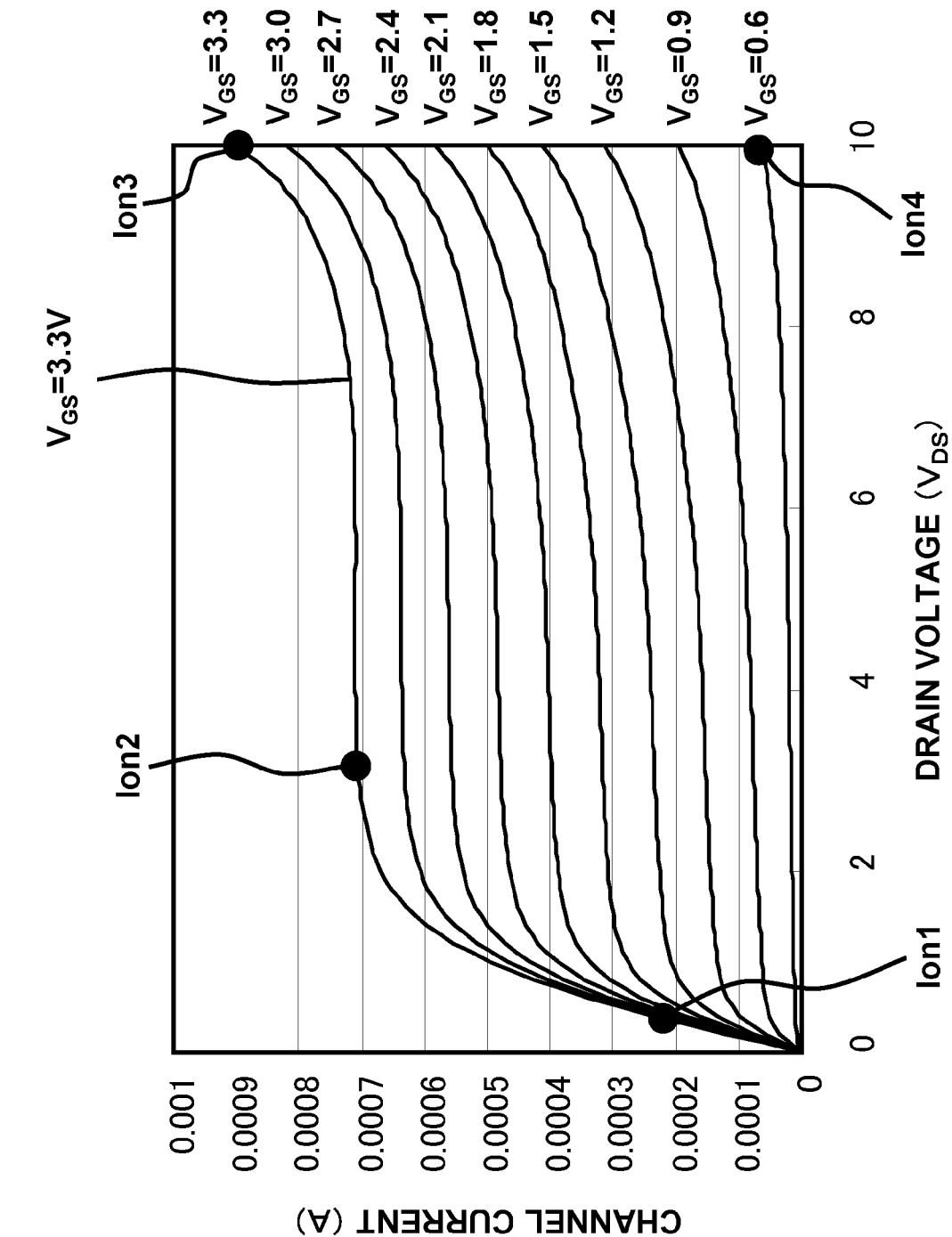
FIG. 14 is a graph illustrating characteristics (IV) of current to voltage of the n-type MIS transistor 50b according to the second embodiment.

FIG. 14 is a graph illustrating characteristics (IV) of current to voltage of the n-type MIS transistor 50b, similarly to FIG. 6. The abscissa denotes the drain voltage ($V_{DS}$) and the ordinate denotes the channel current. Further, FIG. 14 illustrates a plurality of IV curves obtained by changing the gate voltage ($V_{GS}$) from 0.6V to 3.3V by 0.3V. As the gate voltage increases, a current value increases at a predetermined drain voltage and the IV curve rises up.

There are a plurality of operating points Ion illustrated in FIG. 14. At an operating point Ion4, the gate voltage is 0.6 V and the drain voltage is high, i.e., 10V. That is, at the operating point Ion4, the differential between potentials of the gate and the drain is greatly large, i.e., 10V. At an operating point Ion3, the gate voltage is 3.3V and the drain voltage is 10V.

The movements at the operating points Ion4 and Ion3 become indexes indicating a withstanding voltage. At the operating points Ion4 and Ion3, the channel current does not sharply increase and the withstanding voltage is obviously not-less-than 10V.

On the other hand, at an operating point Ion1, the gate voltage is 3.3V and the drain voltage is low, i.e., 0.1V. The movement at the operating point Ion1 becomes an index indicating the on-resistance (Ron). At the operating point Ion1, the channel current sharply rises up and the parasitic resistance is obviously low. Incidentally, at an operating point Ion2, the gate voltage is 3.3V and the drain voltage is 3.3V.

Figure 15:
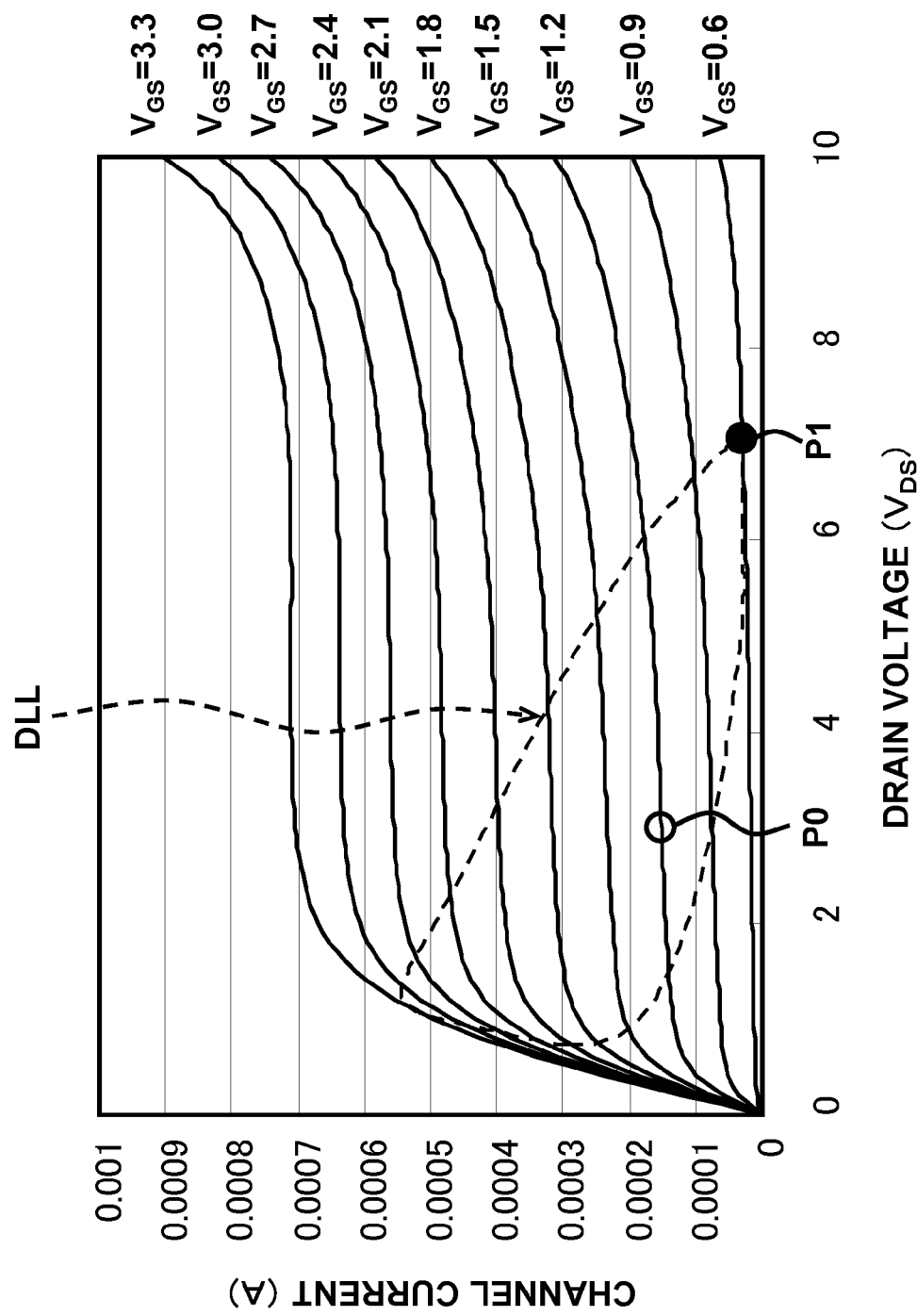
FIG. 15 is a graph illustrating a dynamic load line of a power amplification transistor as an application example of the n-type MIS transistor 50b according to the second embodiment.

FIG. 15 is a graph illustrating a dynamic load line of a power amplification transistor as an application example of the n-type MIS transistor 50b according to the second embodiment. The abscissa in the graph denotes the drain voltage on the unit basis of V (volt), and the ordinate denotes current on the unit basis of A (ampere). Further, IV curves and a dynamic load line DLL are illustrated when the gate voltage $V_{GS}$ is 0.6V, 0.9V, 1.2V, 1.5V, 1.8V, 2.1V, 2.4V, 2.7V, 3.0V, and 3.3V. The dynamic load line DLL illustrates a mutual relation between the drain voltage and the channel current when the gate voltage changes.

On the dynamic load line DLL, the drain voltage is 7V as the highest one and the gate voltage is 0.6V, i.e., close to 0V at an operating point P1. At a bias point P0, the movement of the power amplification transistor is viewed as DC.

To the operating voltage of 3.3V, the drain voltage at the operating point P1 is 7V, approximately to not-less-than the double thereof. To the operating voltage, such withstanding voltage performance is required to be against at least twice or more of the differential between potentials of the gate and the drain.

The n-type MIS transistor 50b according to the second embodiment has the second drain region 22b having an intermediate impurity concentration, thereby improving the withstanding voltage performance. The n-type MIS transistor 50b according to the second embodiment is thus preferable to the use as the power amplification transistor. Incidentally, the gate insulating film 6 of the MIS transistor according to the second embodiment has a withstanding operating voltage of 3.3V by using DC.

As mentioned above, the n-type MIS transistor 50b is structured according to the second embodiment. As a consequence, it is possible to obtain the withstanding voltage performance against a high differential between potentials of the gate and the drain, occurring at the use with a high frequency of a GHz zone, used for a power amplifier with the gate insulating film to which the withstanding voltage performance of 3.3V is assumed by using DC, similarly to the n-type MIS transistor 50a according to the first embodiment.

Figure 16:
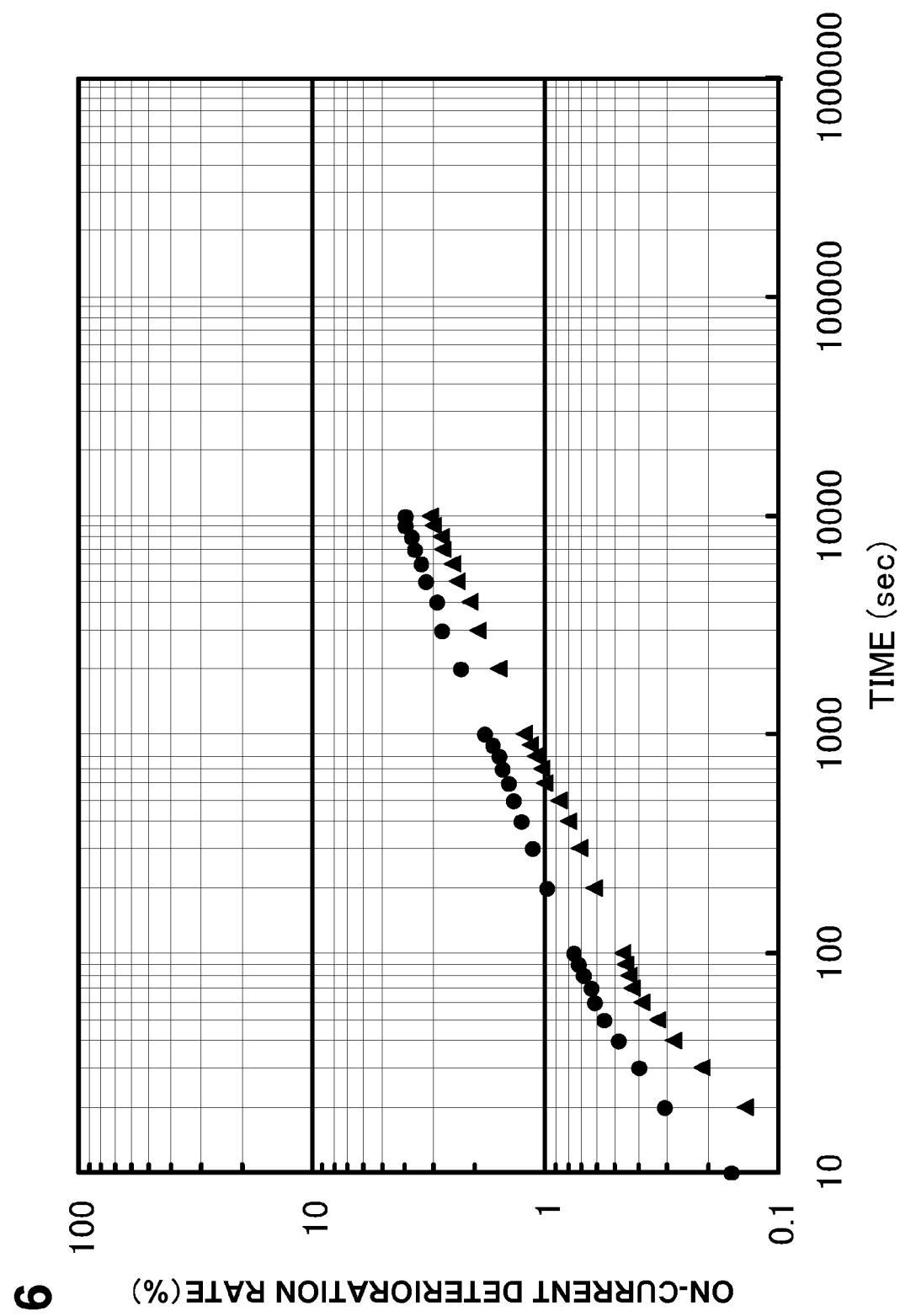
FIG. 16 is a graph illustrating a deteriorating rate (%) of on-current of the n-type MIS transistor 50b according to the second embodiment.

FIG. 16 is a graph for measuring the deteriorating rate of on-current (Ion) with an accelerated deterioration test of the n-type MIS transistor 50b according to the second embodiment. The accelerated deterioration test is performed under stress conditions of Vds=7.8V and Vgs=3.3V and a temperature of 25° C.

The abscissa denotes time (sec), and the ordinate denotes a deteriorating rate of on-current (Ion). Plotting with black circle in FIG. 16 denotes, as a comparison, data on a conventional n-type MIS transistor having a structure excluding the second drain region 22b with an intermediate impurity concentration from the n-type MIS transistor 50b. Plotting with black triangle in FIG. 16 denotes data on the n-type MIS transistor 50b according to the second embodiment.

As will be obviously understood with reference to FIG. 16, the plotting according to the first embodiment shifts to the down side in relation to the comparison. The deteriorating rate of the on-resistance depends on the amount of generated hot carriers at the drain region. As the deteriorating rate of the on-resistance is lower, the amount of generated hot carriers of the drain region is obviously low. Therefore, the amount of generated hot carriers at the drain region according to the second embodiment is obviously lower than that of the comparison. That is, it is estimated to more suppress the deterioration in on-current at the gate electrode and the end of the drain region according to the second embodiment.

Because it is estimated that the formation of the second drain region 22b having the second impurity concentration higher than the first impurity concentration within the first drain region 5 enables control operation of the increase in electrical field at the gate electrode 7 and the end of the first drain region 5 and the generation of hot carriers due to the increase in electrical field with the n-type MIS transistor 50b according to the second embodiment. Further, it is estimated that the silicide layer 13 on the second drain region 22b enables the prevention of the increase in parasitic resistance at the drain region.

The second drain region 22b having the third impurity concentration higher than the second impurity concentration is formed within the first drain region 5 with the n-type MIS transistor 50b according to the second embodiment. As a consequence, it is possible to control the increase in electrical field at the gate electrode 7 and the end of the first drain region 5, to relieve electrical field near the gate electrode 7 of the first drain region 5 and the end of the first drain region 5 due to the increase in electrical field, and to control the generation of hot carriers. Further, the silicide layer 13 on the second drain region 22b prevents the increase in parasitic resistance at the drain region. Therefore, a high withstanding voltage is realized and the deterioration in on-current is prevented, thereby improving the reliability. Accordingly, it is possible to provide a semiconductor device including the n-type MIS transistor 50b to suppress the increase in on-resistance and improve a withstanding voltage and a method of manufacturing the semiconductor device.

Further, thermal processing spreads the third drain region 22a to the first drain region 5, thereby forming the second drain region 22b having the third impurity concentration higher than the second impurity concentration. Therefore, an operation of forming the second drain region 22b by ion injection is not required unlike the first embodiment, thereby reducing an operation of manufacturing the n-type MIS transistor 50b.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments have been described in detail, it should be understood that the various changes, substitutions, and alterations could be made hereto without departing from the spirit and scope of the invention.

What is claimed is:

1. A method of manufacturing a semiconductor device, comprising:
    preparing a semiconductor substrate;
    forming a first drain region in the semiconductor substrate, the first drain region having a first impurity concentration;
    forming a gate insulating film over the semiconductor substrate;
    forming a gate electrode extending over one end of the first drain region over the gate insulating film;
    forming a first source region in the semiconductor substrate on an opposite side of the first drain region across the gate electrode, the first source region having a second impurity concentration;
    forming a sidewall over the semiconductor substrate and over a sidewall of the gate electrode;
    forming a first resist layer over the gate electrode and the first source region;
    forming a second drain region in the first drain region by implanting first ions by using the first resist layer, the gate electrode, and the sidewall as a mask, and performing a first thermal treatment to the semiconductor substrate, the second drain region having a third impurity concentration higher than the first impurity concentration;
    forming a second resist layer over the gate electrode and the second drain region, the second resist layer extending from the gate electrode by a distance;
    forming a second source region in the first source region, and a third drain region in the second drain region by implanting second ions by using the sidewall, the gate electrode, and the second resist layer as a mask, and performing a second thermal treatment to the semiconductor substrate, the second source region having a fourth impurity concentration higher than the second impurity concentration, the third drain region having a fifth impurity concentration higher than the third impurity concentration;
    forming a silicide layer over the surface of the semiconductor substrate in the area of the second drain region and the third drain region.

2. The method according to claim 1, wherein:
    the forming the first source region formed in the first area of the semiconductor substrate on one side of the gate electrode and the first drain region, the first source region having the second impurity concentration is performed by forming the first source region to have a first depth of the semiconductor substrate;
    the forming the second source region in the first source region, and the third drain region in the second drain region by implanting the second ions by using the sidewall, the gate electrode, and the second resist layer as the mask; and
    the performing the second thermal treatment to the semiconductor substrate, the second source region having the fourth impurity concentration higher than the second impurity concentration, the third drain region having the fifth impurity concentration higher than the third impurity concentration is performed by forming the second source region to have a second depth deeper than the first depth of the semiconductor substrate.

* * * * *